United States Patent
Ikeda et al.

(10) Patent No.: US 11,233,499 B2
(45) Date of Patent: Jan. 25, 2022

(54) QUARTZ CRYSTAL UNIT AND METHOD OF MANUFACTURING THE SAME

(71) Applicant: Murata Manufacturing Co., Ltd., Nagaokakyo (JP)

(72) Inventors: Isao Ikeda, Nagaokakyo (JP); Motonori Matsushita, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 857 days.

(21) Appl. No.: 16/032,159

(22) Filed: Jul. 11, 2018

(65) Prior Publication Data

US 2018/0323768 A1    Nov. 8, 2018

Related U.S. Application Data

(63) Continuation of application No. PCT/JP2016/082531, filed on Nov. 2, 2016.

(30) Foreign Application Priority Data

Jan. 21, 2016 (JP) .............................. JP2016-010084

(51) Int. Cl.
*H03H 9/19* (2006.01)
*H03H 3/02* (2006.01)
(Continued)

(52) U.S. Cl.
CPC ................ *H03H 9/19* (2013.01); *H03H 3/02* (2013.01); *H03H 9/0595* (2013.01);
(Continued)

(58) Field of Classification Search
CPC ...... H03H 9/19; H03H 9/0595; H03H 9/1035; H03H 9/13; H03H 3/02; H03H 2003/022
See application file for complete search history.

(56) References Cited

U.S. PATENT DOCUMENTS 5,585,687 A * 12/1996 Wakabayashi ....... H03H 9/1014
310/344
8,261,427 B2    9/2012 Inose et al.
(Continued)

FOREIGN PATENT DOCUMENTS

JP    H09331224 A    12/1997
JP    2009060479 A    3/2009
(Continued)

OTHER PUBLICATIONS

International Search Report issued in International Application No. PCT/JP2016/082531, dated Jan. 24, 2017.
(Continued)

*Primary Examiner* — Jeffrey M Shin
(74) *Attorney, Agent, or Firm* — Arent Fox LLP

(57) ABSTRACT

A quartz crystal unit that includes a quartz crystal resonator with a quartz crystal blank on which a pair of excitation electrodes are formed, a frame body that surrounds an outer periphery of the blank, and a coupling member that couples the frame body to the blank. Moreover, a package member is joined to an entire periphery of the frame body on at least one side of the excitation electrodes; and an extension electrode is provided that is electrically connected to one of the excitation electrodes. A recess is formed in a junction region of at least one of the frame body and the package member. In the junction region, the extension electrode is disposed in the recess in such a way that the extension electrode has a thickness that does not exceed a depth of the recess.

21 Claims, 15 Drawing Sheets

(51) Int. Cl.
*H03H 9/05* (2006.01)
*H03H 9/10* (2006.01)
*H03H 9/13* (2006.01)

(52) U.S. Cl.
CPC .......... *H03H 9/1035* (2013.01); *H03H 9/13* (2013.01); *H03H 2003/022* (2013.01)

(56) References Cited

U.S. PATENT DOCUMENTS

| | | |
|---|---|---|
| 8,476,811 B2 | 7/2013 | Mizusawa et al. |
| 2010/0162545 A1 | 7/2010 | Inose et al. |
| 2012/0032561 A1 | 2/2012 | Mizusawa et al. |

FOREIGN PATENT DOCUMENTS

| | | |
|---|---|---|
| JP | 2012060628 A | 3/2012 |
| JP | 2015165613 A | 9/2015 |

OTHER PUBLICATIONS

Written Opinion of the International Searching Authority issued in International Application No. PCT/JP2016/082531, dated Jan. 24, 2017.

\* cited by examiner

QUARTZ CRYSTAL UNIT AND METHOD OF MANUFACTURING THE SAME

CROSS REFERENCE TO RELATED APPLICATIONS

The present application is a continuation of PCT/JP2016/082531 filed Nov. 2, 2016, which claims priority to Japanese Patent Application No. 2016-010084, filed Jan. 21, 2016, the entire contents of each of which are incorporated herein by reference.

TECHNICAL FIELD

The present disclosure relates to a quartz crystal unit and a method of manufacturing the quartz crystal unit.

BACKGROUND

Quartz crystal units, whose main vibration mode is thickness shear mode, are widely used as oscillation devices, bandpass filters, and the like. For example, an existing structure of a quartz crystal unit includes a quartz crystal resonator plate and a pair of sealing members that are disposed respectively on an upper surface and a lower surface of the quartz crystal resonator plate via a joining material (see Patent Document 1 identified below). The joining material is a brazing alloy or the like, and due to the presence of the joining material, a vibration portion of the quartz crystal resonator plate is hermetically sealed when the quartz crystal resonator plate is joined to the sealing members.

Patent Document 1: Japanese Unexamined Patent Application Publication No. 2015-165613.

However, for example, when the quartz crystal resonator plate and the sealing members are joined to each other via the joining material as described in Patent Document 1, a space having a thickness corresponding to the joining member is formed in the quartz crystal unit, and thereby wafer breakage may easily occur in the process of cutting out individual units from a wafer. On the other hand, if the quartz crystal resonator plate and the sealing members are directly joined to each other, due to the effect of a protrusion of an extension electrode formed in a junction region, the joining strength between the quartz crystal resonator plate and the sealing members may decrease.

Accordingly, with the existing structure, it is not possible to provide sufficient hermeticity for the quartz crystal resonator plate, and the reliability of the quartz crystal unit is not necessarily high.

SUMMARY OF THE INVENTION

The exemplary embodiments of the present disclosure have been made in consideration of the above circumstances, and an object thereof is to improve the joining strength between a frame body of a quartz crystal resonator and a package member for accommodating a quartz crystal blank and to improve the reliability of the product.

Thus, a quartz crystal unit according to an exemplary aspect is disclosed herein that includes a quartz crystal resonator including a quartz crystal blank on which a pair of excitation electrodes that face each other are formed, a frame body that surrounds an outer periphery of the quartz crystal blank, and a coupling member that couples the frame body and the quartz crystal blank to each other; a package member that is joined to an entire periphery of the frame body on at least one side of the pair of excitation electrodes; and an extension electrode that is electrically connected to one of the pair of excitation electrodes. A recess is formed in a junction region of at least one of the frame body and the package member, the junction region being a region where the frame body and the package member are joined to each other. In the junction region, the extension electrode is disposed in the recess in such a way that the extension electrode has a thickness that does not exceed a depth of the recess.

With the exemplary embodiments of the present disclosure, it is possible to improve the joining strength between a frame body of a quartz crystal resonator and a package member for accommodating a quartz crystal blank and to improve the reliability of the product.

DETAILED DESCRIPTION OF EXEMPLARY EMBODIMENTS

Figure 1:
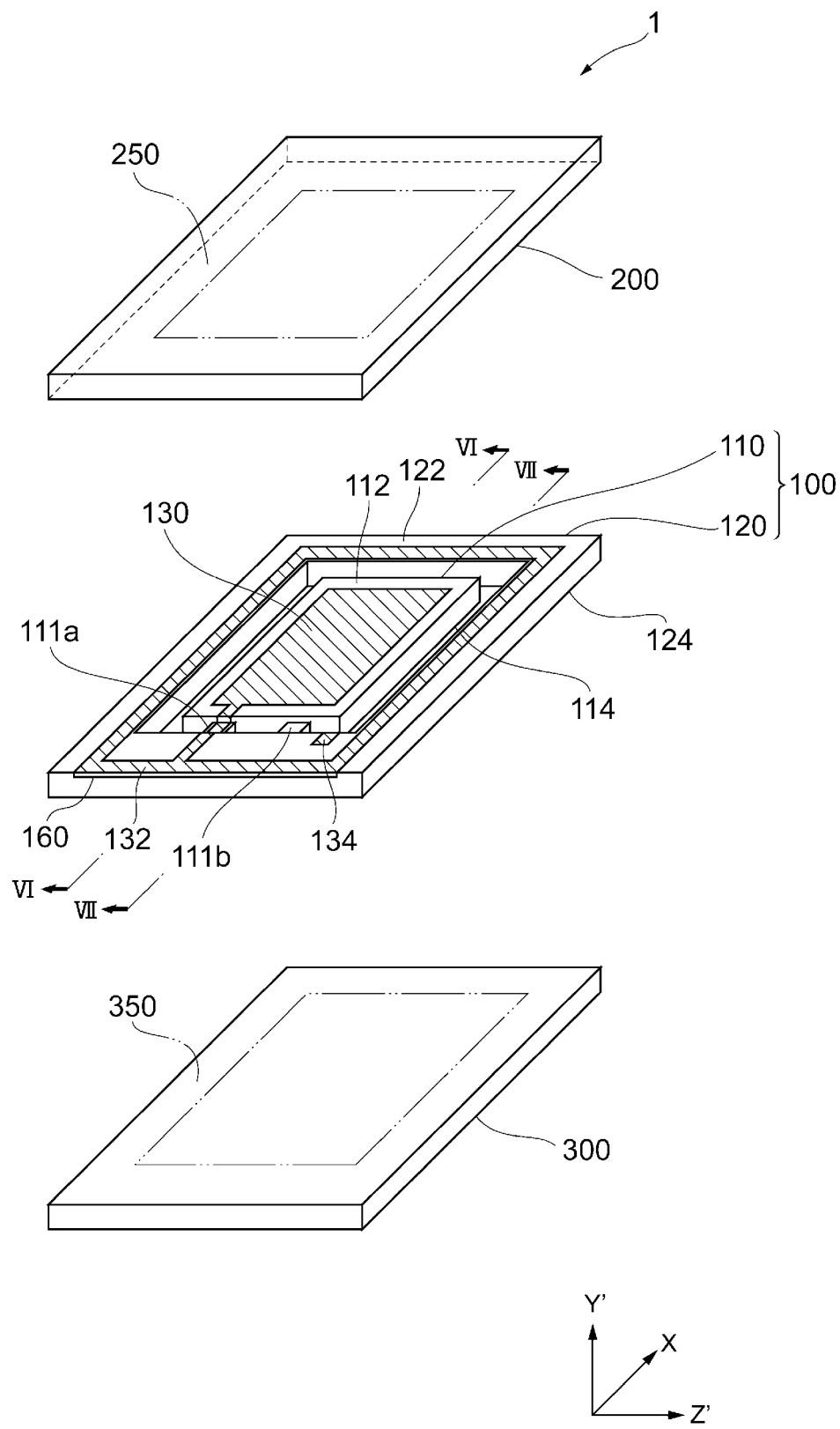
FIG. 1 is an exploded perspective view of a quartz crystal unit according to a first exemplary embodiment.

Hereinafter, exemplary embodiments of the present disclosure will be described. In the drawings used in the following description, elements that are the same as or similar to each other are denoted by the same or similar numerals. The drawings show examples, and the dimensions and shapes of elements in the drawings are schematic. It should be noted that the technical scope is not limited to the exemplary embodiments described herein.

Figure 2:
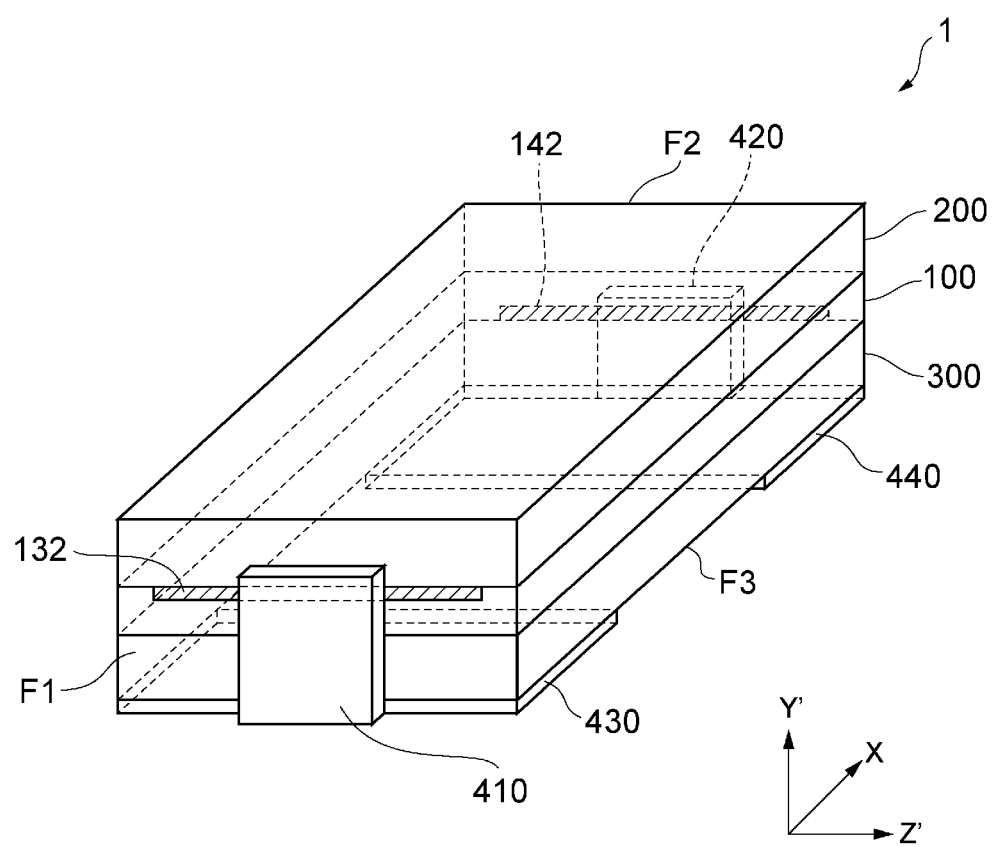
FIG. 2 is a perspective view of the quartz crystal unit according to the first exemplary embodiment.
Figure 3:
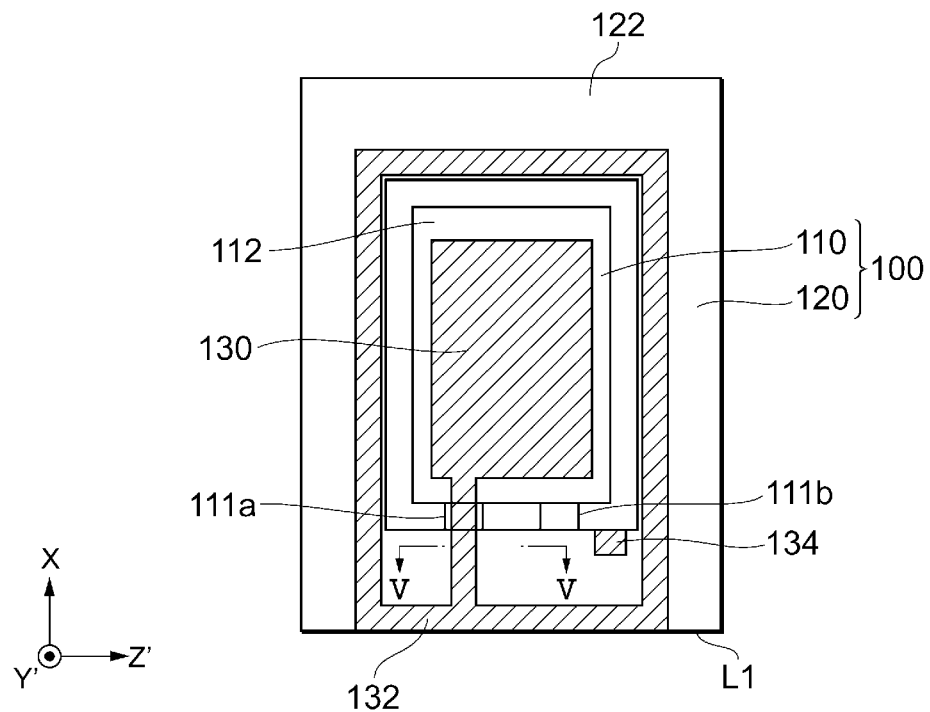
FIG. 3 is a plan view of a quartz crystal resonator according to the first exemplary embodiment.
Figure 4:
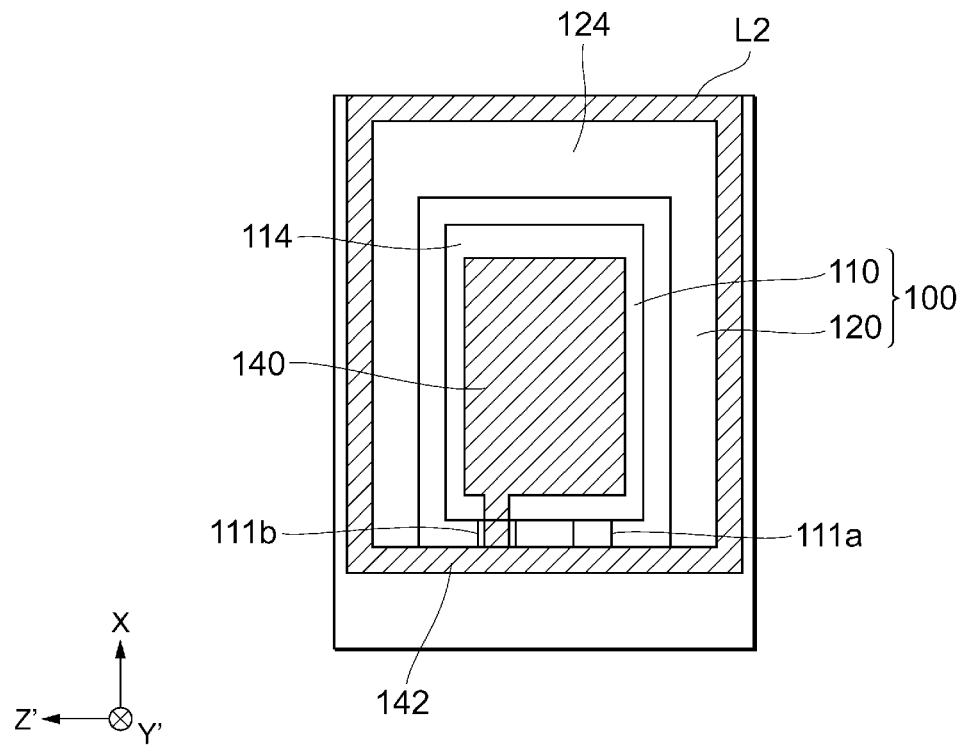
FIG. 4 is a plan view of the quartz crystal resonator according to the first exemplary embodiment.
Figure 5A:
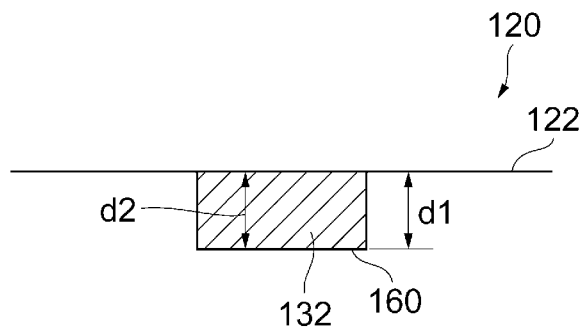
FIGS. 5(A) and 5(B) are sectional views taken along line V-V of FIG. 3.
Figure 5B:
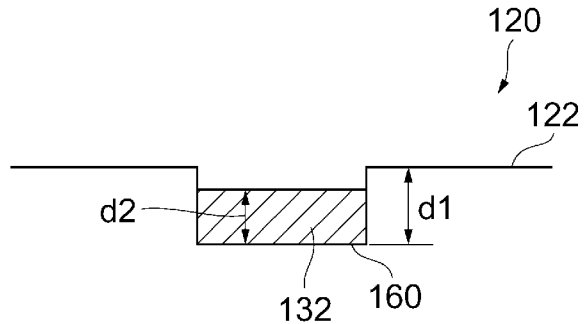
Figure 6:
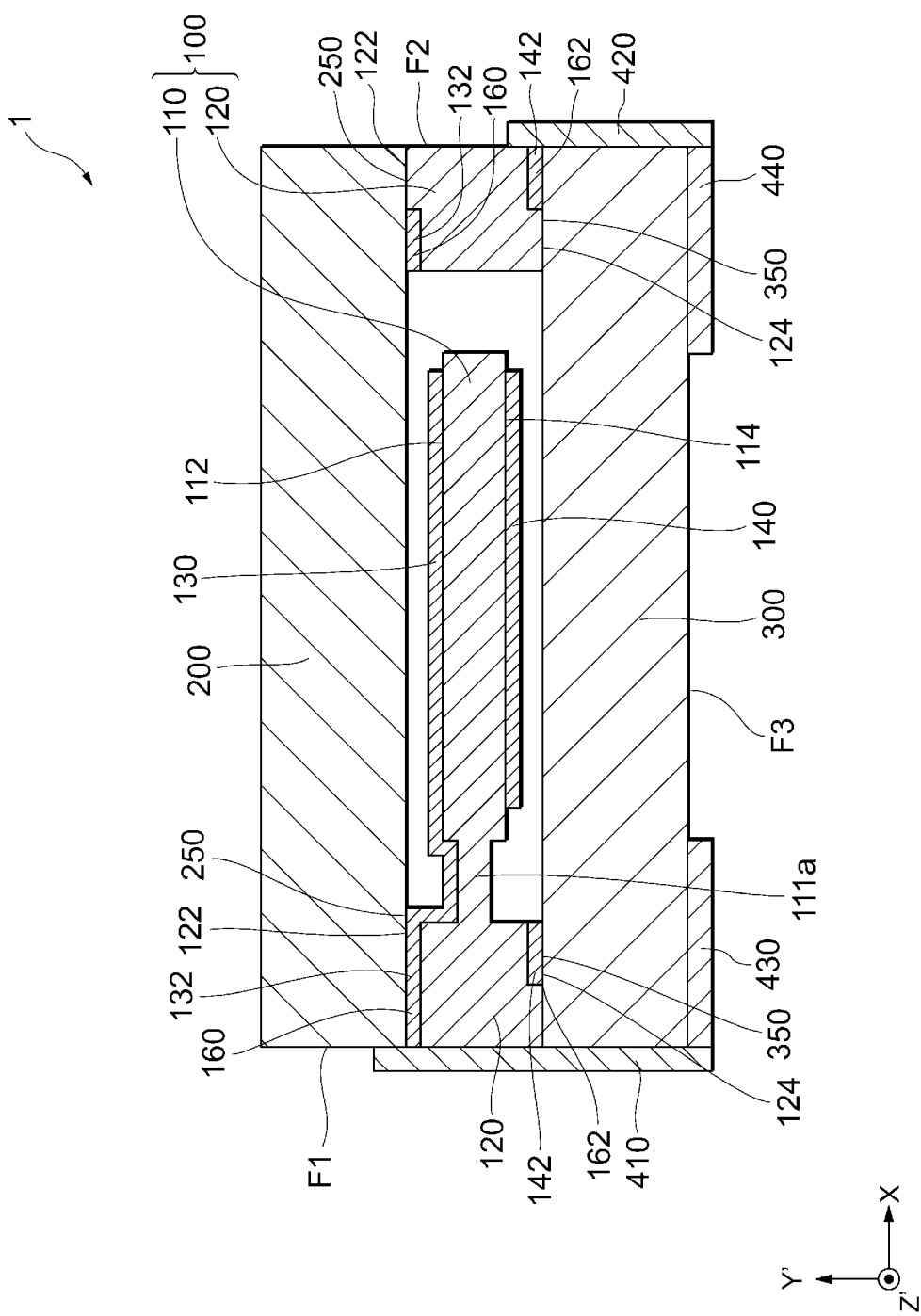
FIG. 6 is a sectional view taken along line VI-VI of FIG. 1.
Figure 7:
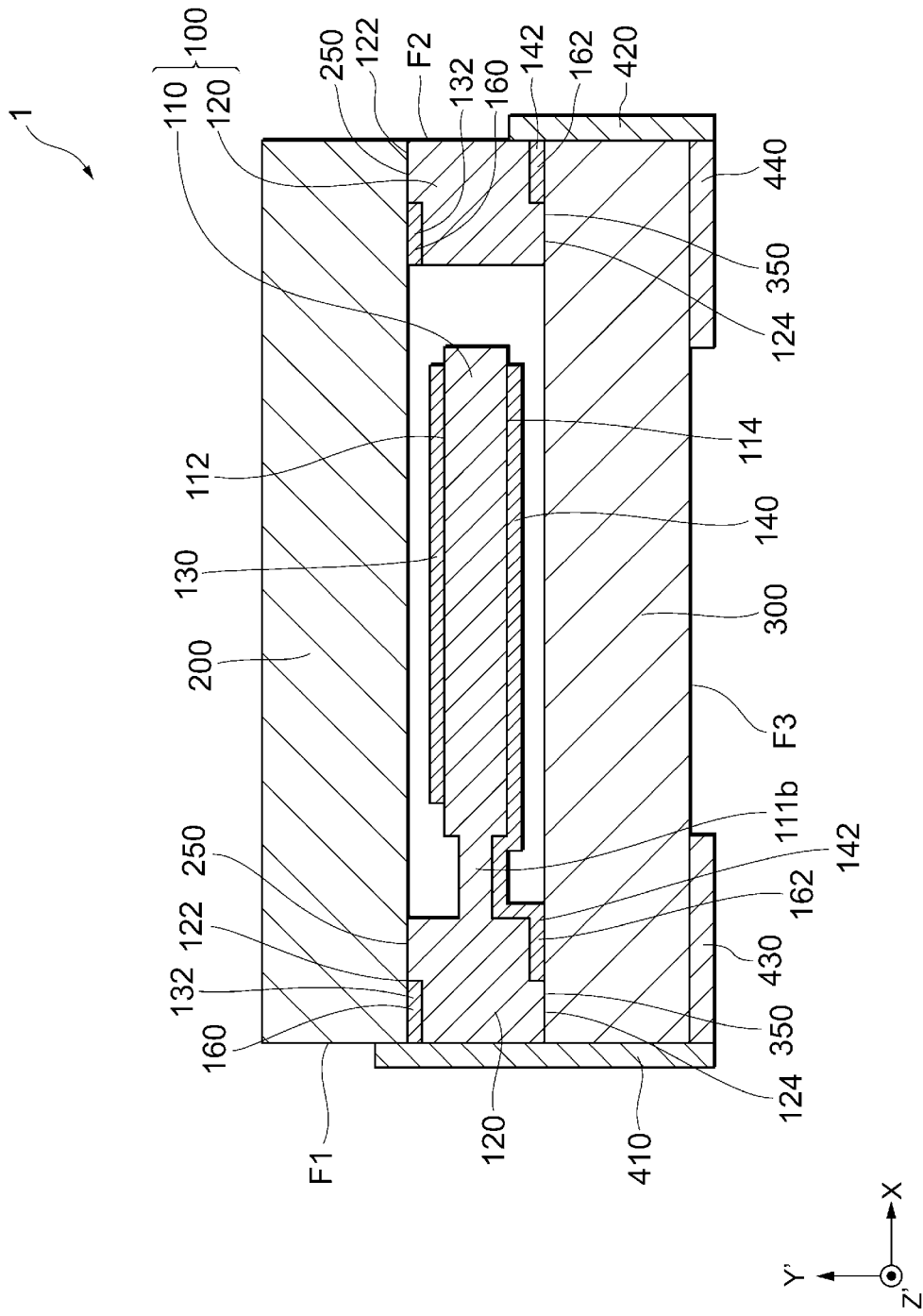
FIG. 7 is a sectional view taken along line VII-VII of FIG. 1.

Referring to FIGS. 1 to 7, a quartz crystal unit according to a first exemplary embodiment will be described. FIG. 1 is an exploded perspective view of the quartz crystal unit according to the first exemplary embodiment. FIG. 2 is a perspective view of the quartz crystal unit. FIGS. 3 and 4 are plan views of a quartz crystal resonator. FIGS. 5(A) and 5(B) are sectional views taken along line V-V of FIG. 3. FIG. 6 is a sectional view taken along line VI-VI of FIG. 1. FIG. 7 is a sectional view taken along line VII-VII of FIG. 1.

As illustrated in FIGS. 1 and 2, a quartz crystal unit 1 according to the first exemplary embodiment includes a quartz crystal resonator 100; a lid member 200; a base member 300; and outer electrodes 410, 420, 430, and 440. It is noted that in FIG. 1, the outer electrodes 410, 420, 430, and 440 are omitted from the view; and the same applies to other exploded perspective views (FIGS. 12, 14, 16, and 17).

The quartz crystal resonator 100 includes, for example, an AT-cut quartz crystal substrate. An AT-cut quartz crystal substrate is cut out so that, when an X-axis, a Y-axis, and a Z-axis are the crystal axes of a synthetic quartz crystal and a Y'-axis and a Z'-axis are respectively axes that are obtained by rotating the Y-axis and the Z-axis around the X-axis by 35 degrees 15 minutes±1 minute 30 seconds in a direction from the Y-axis toward the Z-axis, the quartz crystal substrate has a main surface that is parallel to a plane defined by the X-axis and the Z'-axis. A quartz crystal resonator using an AT-cut quartz crystal element has high frequency stability in a wide temperature range, has high durability, and can be manufactured at low cost. A vibration in a thickness sheer mode is used as a main vibration of an AT-cut quartz crystal resonator. Hereinafter, components of the quartz crystal unit will be described with respect to the axial directions of AT-cut.

The lid member 200 and the base member 300, each of which is an example of a package member for purposes of this disclosure, are joined to the quartz crystal resonator 100 so as to accommodate a part (at least the quartz crystal blank) of the quartz crystal resonator 100. According to the exemplary embodiment, the quartz crystal resonator 100, the lid member 200, and the base member 300 have substantially the same planar shape (for example, a rectangular shape) in plan view as seen in the thickness direction thereof.

The quartz crystal resonator 100 includes a quartz crystal blank 110, a frame body 120 (also simply considered a "frame") that surrounds the outer periphery of the quartz crystal blank 110, and coupling members 111a and 111b that couple the quartz crystal blank 110 and the frame body 120 to each other. The quartz crystal blank 110, the frame body 120, and the coupling members 111a and 111b are each made from, for example, an AT-cut quartz crystal substrate. As a whole, the quartz crystal resonator 100 has long sides that are parallel to the X axis, short sides that are parallel to the Z' axis, and a thickness that is parallel to the Y' axis. The quartz crystal blank 110 is disposed separated from the frame body 120. The quartz crystal blank 110 and the frame body 120 are coupled to each other by at least one coupling member (two coupling members 111a and 111b in the example shown in FIG. 1). As illustrated in FIG. 1, the coupling members 111a and 111b are disposed at one end of the quartz crystal blank 110 in the X axis direction (on the negative X side). It is noted that the number, the arrangement, and the like of the coupling members are not particularly limited. For example, only one coupling member may be disposed at one end of the quartz crystal blank 110 in the X axis direction. Alternatively, one of two coupling members may be disposed at one end of the quartz crystal blank 110 in the X axis direction, and the other coupling member may be disposed at the other end in the X axis direction.

Moreover, the thickness of the quartz crystal resonator 100 in the direction parallel to the Y' axis is not particularly limited. For example, in one aspect, the thickness of the frame body 120, the thickness of the quartz crystal blank 110, and the thickness of each of the coupling members 111a and 111b gradually decrease in this order (see FIGS. 6 and 7). By forming the frame body 120 so as to be thicker than the quartz crystal blank 110, it is easy to form a space in which the quartz crystal blank 110 can vibrate, when a package member (such as the lid member 200 or the base member 300) is joined to the quartz crystal blank 110. Alternatively, for example, the frame body and the quartz crystal blank may have the same thickness; and recesses, which are recessed in the Y' axis direction, may be formed in surfaces of the lid member and the base member that are to be joined to the quartz crystal resonator so as to form an inner space that accommodates the quartz crystal blank.

Next, referring to FIGS. 3 to 7, electrodes formed in the quartz crystal resonator 100 will be described. FIG. 3 is a plan view showing a first surface 112 of the quartz crystal blank 110 and a first surface 122 of the frame body 120 according to the first embodiment. FIG. 4 is a plan view showing a second surface 114 of the quartz crystal blank 110 and a second surface 124 of the frame body 120.

As illustrated in FIGS. 3 and 4, a first excitation electrode 130 and a second excitation electrode 140 are formed on a pair of main surfaces of the quartz crystal blank 110. To be specific, the first excitation electrode 130 is formed on the first surface 112 of the quartz crystal blank 110 (surface on the positive Y' side), and the second excitation electrode 140 is formed on the second surface 114 of the quartz crystal blank 110 (surface on the negative Y' side). According to the exemplary aspect, the first excitation electrode 130 and the second excitation electrode 140 are disposed as a pair of electrodes in such a way that substantially the entireties thereof overlap each other. Moreover, an extension electrode 132, which is electrically connected to the first excitation electrode 130, is formed on the first surface 122 of the frame body 120. An extension electrode 142, which is electrically connected to the second excitation electrode 140, is formed on the second surface 124 of the frame body 120.

As illustrated in FIG. 3, the extension electrode 132 extends from the first excitation electrode 130 through the coupling member 111a onto the first surface 122 of the frame body 120 so as to come into contact with an edge L1 of the surface on the negative X side. As illustrated in FIG. 4, the extension electrode 142 extends from the second excitation electrode 140 through the coupling member 111b onto the second surface 124 of the frame body 120 so as to come into contact with an edge L2 of the surface on the positive X side (opposite to the edge L1). According to this configuration, it is possible to provide, at each of the edges that face each other in the X axis direction, an outer electrode (described below) that is electrically connected to a corresponding one of the extension electrodes 132 and 142. The direction in which the extension electrodes 132 and 142 extend is not limited to the X axis direction. The direction may be, for example, the Z' axis direction, or may be appropriately changed in accordance with the positions where the outer electrodes are formed.

In the present embodiment, the extension electrode 132 extends so as to surround the entire periphery of the first surface 122 of the frame body 120 (see FIG. 3), the extension electrode 142 extends so as to surround the entire periphery of the second surface 124 of the frame body 120 (see FIG. 4), and the extension electrodes 132 and 142 are disposed so that at least parts thereof do not overlap in plan view as seen in the Y' axis direction. To be specific, in the example illustrated in the figures, except for at least one edge (for example, the edge L1), the extension electrode 132 is disposed near the inner periphery of the frame body 120, and the extension electrode 142 is disposed near the outer periphery of the frame body 120. Thus, it is advantageously possible to separate the extension electrodes 132 and 142 from each other by a large distance and to reduce the effect of noise of one of the extension electrodes on the other extension electrode.

In the present embodiment, the extension electrodes 132 and 142 are formed so as to surround the entire peripheries of the first surface 122 and the second surface 124 of the frame body 120. However, the arrangement of the extension electrodes is not particularly limited. That is, as long as the extension electrodes 132 and 142 extend so as to come into contact with any of end surfaces of the frame body 120, the extension electrodes 132 and 142 need not surround the entire periphery of the frame body 120.

As further shown in FIG. 1, for example, an inspection electrode 134 is formed on the first surface 122 of the frame body 120. The inspection electrode 134 is electrically connected to the extension electrode 142 (which is electrically connected to the second excitation electrode 140), which is formed on the second surface 124 facing the first surface 122. The inspection electrode 134 allows an electrical inspection to be performed on the first and second excitation electrodes 130 and 140 from one side of the frame body 120 (for example, from the first surface 122 side). Accordingly, it is easy to perform an electrical inspection for checking the operation of the quartz crystal resonator 100 or the like.

As described below, the extension electrodes 132 and 142 and the inspection electrode 134 are disposed in recesses formed in the first surface 122 and the second surface 124 of the frame body 120 according to an exemplary aspect. The same applies to perspective views and plan views described below.

The electrodes described above, including the first and second excitation electrodes 130 and 140 and the extension electrodes 132 and 142, may each include a chrome (Cr) underlying layer and a gold (Au) layer formed on the surface of the chrome layer. However, it is noted that the material of these electrodes is not limited.

As illustrated in FIGS. 6 and 7, the lid member 200 is disposed on the first surface 122 side (one side) of the frame body 120; the base member 300 is disposed on the second surface 124 side (the other side) of the frame body 120; and the lid member 200, the quartz crystal resonator 100, and the base member 300 form a three-layer structure in this stacking order. The thicknesses of the lid member 200, the quartz crystal resonator 100, and the base member 300 are not particularly limited. However, for example, as illustrated in the figures, the lid member 200 and the base member 300 may be slightly thicker than the frame body 120 of the quartz crystal resonator 100.

As further shown, the lid member 200 in joined to the entire periphery of the first surface 122 of the frame body 120 of the quartz crystal resonator 100. The base member 300 in joined to the entire periphery of the second surface 124 of the frame body 120 of the quartz crystal resonator 100. Thus, the quartz crystal blank 110 is hermetically sealed in an inner space (cavity). In this case, a junction region 250 of the lid member 200 (a region of the lid member 200 that is on the negative Y' side and to which the frame body 120 is joined) and the first surface 122 (junction region) of the frame body 120 are directly joined to each other without using a joining member, such as an adhesive or a glass joining member, for joining these. Likewise, a junction region 350 of the base member 300 (a region of the base member 300 that is on the positive Y' side and to which the frame body 120 is joined) and the second surface 124 (junction region) of the frame body 120 are directly joined to each other. Thus, a joining member is not necessary, and, for example, it is possible to suppress detachment of joint due to stress concentration caused by a difference in thermal expansion or a difference in modulus of elasticity between the joining member and the quartz crystal resonator 100, the lid member 200, or the base member 300.

It should be noted that according to the exemplary aspects of the present disclosure, use of the joining member is not precluded. Thus, in an alternative aspect, the lid member 200 and the frame body 120, and, the base member 300 and the frame body 120 may be joined to each other via a joining member. The material of the joining member is not limited, as long as the joining member can join the junction regions to each other and can hermetically seal the inner space. For example, a glass joining material, such as low-melting-temperature glass (for example, lead borate glass or tin phosphate glass), or a resin adhesive (for example, epoxy adhesive) may be used according to various exemplary aspects.

Moreover, the material of each of the lid member 200 and the base member 300 is not particularly limited. For example, preferably, the material is the same as the material of the quartz crystal resonator 100 and may be, for example, a quartz crystal. In this case, since the members to be joined are made of the same material, the thermal expansion coefficients of the members are close to each other, and a residual stress during a joining operation can be reduced. In particular, when the lid member 200 and the base member 300 are each made of an AT-cut quartz crystal, which is the same as the material of the quartz crystal resonator 100, not only the materials are the same but also the crystal axis directions are the same. Therefore, the thermal expansion coefficients coincide with each other, and the residual stress during a joining operation can be further reduced. Alternatively, the lid member 200 and the base member 300 may each be made of a material other than a quartz crystal. The material may be, for example, a glass material, a quartz crystal material, a glass epoxy material in which glass fibers are impregnated with an epoxy resin, or the like.

As illustrated in FIG. 1, the lid member 200 and the base member 300 are, for example, flat plate-shaped members. Preferably, the first surface 122 and the second surface 124 of the frame body 120, the junction region 250 of the lid member 200, and the junction region 350 of the base member 300 each have a root-mean-square surface roughness (Rms) of less than 1 nm. In this case, the joining force due to intermolecular force is increased, and the sealability is improved when these members are directly joined to each other. More preferably, Rms is 0.7 nm or less in order to increase the joining force.

Next, the outer electrodes will be described with reference to FIGS. 2, 6, and 7. As illustrated in FIG. 2, the outer electrodes 410, 420, 430, and 440 are formed on end surfaces (end surfaces of the quartz crystal resonator 100, the lid member 200, and the base member 300) and the bottom surface (a surface of the base member 300 opposite to the quartz crystal resonator 100) of the quartz crystal unit 1 according to the present embodiment.

The outer electrodes 410, 420, 430, and 440 are each electrically connected to a corresponding one of the first excitation electrode 130 and the second excitation electrode 140 and provide mountability to the quartz crystal unit 1. To be specific, the outer electrode 410 is disposed on a surface F1, which is an end side surface of the quartz crystal unit 1 on the negative X side to which the extension electrode 132 extends, in such a way that the outer electrode 410 covers at least a part of the boundary between the quartz crystal resonator 100 or the lid member 200 and the extension electrode 132 (see FIGS. 2 and 6). The outer electrode 420 is disposed on a surface F2, which is an end side surface of the quartz crystal unit 1 on the positive X side to which the extension electrode 142 extends, in such a way that the outer electrode 420 covers at least a part of the boundary between the quartz crystal resonator 100 or the base member 300 and the extension electrode 142 (see FIGS. 2 and 7). The outer electrode 430 is electrically connected to the outer electrode 410 and is disposed on a bottom surface F3 (surface on the negative Y' side) of the quartz crystal unit 1. The outer electrode 440 is electrically connected to the outer electrode 420 and is disposed on the bottom surface F3 of the quartz crystal unit 1. With the structure described above, it is possible to obtain the quartz crystal unit 1 including the outer electrodes 410 and 430, which are electrically connected to the first excitation electrode 130, and the outer electrodes 420 and 440, which are electrically connected to the second excitation electrode 140. Thus, by applying an alternative-current voltage between the pair of first excitation electrode 130 and second excitation electrode 140 of the quartz crystal resonator 100 via the outer electrodes 410 and 430 on one side and the outer electrodes 420 and 440 on the other side of the quartz crystal unit 1, it is possible to cause the quartz crystal blank 110 to vibrate in a predetermined vibration mode, such as a thickness shear mode, and to obtain resonance characteristics due to the vibration.

With the structure described above, it is possible to electrically connect the first excitation electrode 130 and the second excitation electrode 140 to external electrodes without forming via electrodes (i.e., internally extending electrodes). Accordingly, compared with a structure in which via electrodes are formed, the reliability of the product is improved. Moreover, it is noted that the outer electrodes 410, 420, 430, and 440 may be formed on any appropriate surfaces of the quartz crystal unit 1, as long as the outer electrodes are electrically connected to the extension electrodes. As described below, an outer electrode may be formed on an end surface of the quartz crystal unit in such a way that the outer electrode covers the entirety of the boundary between the quartz crystal resonator, the lid member, or the base member and the extension electrodes. It is possible to further improve the sealability of the quartz crystal unit by covering the boundary.

In the present embodiment, a recess is formed in a junction region (the first surface 122 or the second surface 124) of the frame body 120 where the frame body 120 and the lid member 200 or the base member 300 are joined to each other, and each extension electrode is disposed in the recess in such a way that the extension electrode has a thickness that does not exceed the depth of the recess. Referring to FIGS. 5(A) and 5(B), the relationship between the recess and the extension electrode will be described by using the first surface 122 (junction region) of the frame body 120 as an example.

As illustrated in FIG. 5(A), a recess 160 having a depth d1 is formed in the frame body 120, and the extension electrode 132 having a thickness d2 is disposed in the recess 160. The thickness d2 of the extension electrode 132 and the depth d1 of the recess 160 have a relationship such that d2≤d1. For example, as illustrated in FIG. 5(A), the extension electrode 132 may be formed in such a way that d1=d2 is satisfied and the first surface 122 of the frame body 120 and the surface of the extension electrode 132 are flush with each other. Alternatively, as illustrated in FIG. 5(B), the extension electrode 132 may be formed in such a way that d2<d1 is satisfied and the surface of the extension electrode 132 is recessed from the first surface 122 of the frame body 120 around the extension electrode 132. As described below, preferably, the depth of the recess d1 is 0.05 μm or more and 0.5 μm or less. In the present exemplary embodiment, the depth d1 of the recess is 0.1 μm.

With such a structure, the extension electrode 132 can be formed so as not to protrude from the first surface 122 of the frame body 120 (the junction region with the lid member 200). Accordingly, it is possible to keep the junction region of the frame body 120 with the lid member 200 to be smooth, and it is possible to suppress decrease of the joining strength between the frame body 120 and the lid member 200 due to protrusion of the extension electrode at the junction region. Accordingly, it is possible to provide sufficient hermeticity for the quartz crystal blank 110 and to improve the reliability of the quartz crystal unit 1. The relationship between the recess and the extension electrode is applicable in the same way to the extension electrode 142 on the second surface 124 side of the frame body 120.

As illustrated in FIGS. 6 and 7, the extension electrode 132 is disposed in the recess 160 in the entirety of the first surface 122 (junction region) of the frame body 120, and the extension electrode 142 is disposed in a recess 162 in the entirety of the second surface 124 (junction region) of the frame body 120. Accordingly, the first surface 122 and the second surface 124 of the frame body 120 are both smooth surfaces that do not have protrusions due to the extension electrodes 132 and 142. The junction regions 250 and 350 of the lid member 200 and the base member 300 are flush with each other. Accordingly, at each junction region, the joining strengths between the frame body 120 and the lid member 200 and between the frame body 120 and the base member 300 are each improved.

As illustrated in FIGS. 6 and 7, end surfaces of the quartz crystal resonator 100, the lid member 200, the base member 300, and the extension electrodes 132 and 142 are flush with each other. Thus, entry of foreign substances, such as dust, into the quartz crystal unit 1 and occurrence of cracking of the quartz crystal unit 1 can be suppressed.

Next, based on the flowchart of FIG. 8 and referring to FIGS. 9 to 11, a method of manufacturing a quartz crystal unit according to an exemplary embodiment will be described. In the present embodiment, a method of manufacturing the quartz crystal unit 1 illustrated in FIGS. 1 to 7 will be described as an example. The method of manufacturing a quartz crystal unit according to the present embodiment includes manufacturing by using a wafer-level-packaging technology, in which packaging is performed in a wafer state.

Figure 8:
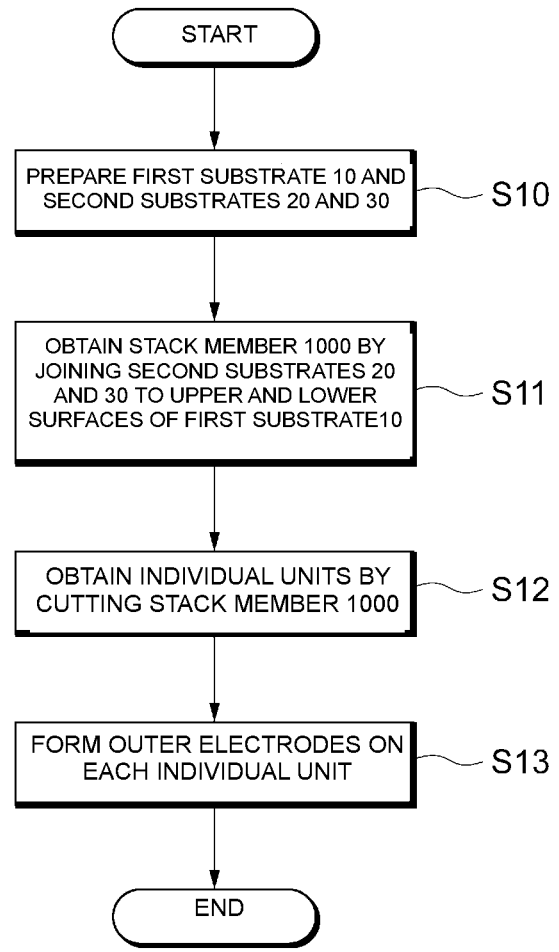
FIG. 8 is a flowchart of a method of manufacturing the quartz crystal unit according to the first exemplary embodiment.
Figure 10:
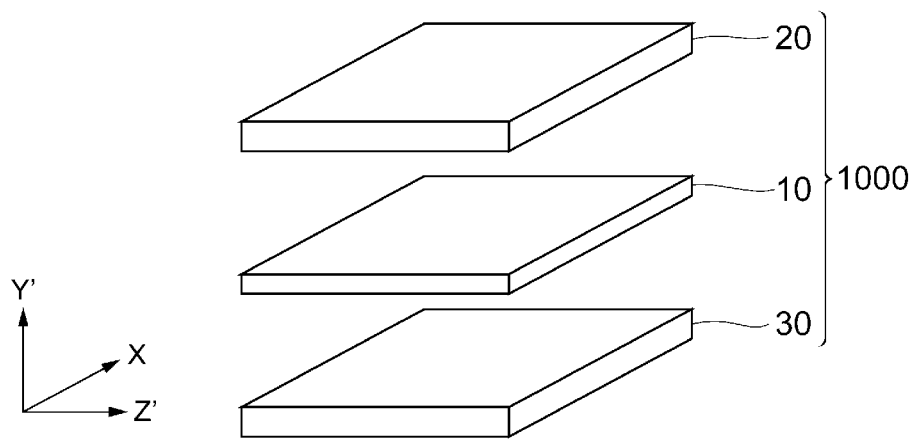
FIG. 10 is a perspective view of substrates, illustrating the method of manufacturing the quartz crystal unit according to the first exemplary embodiment.

First, as illustrated in FIG. 10, a first substrate 10 and a plurality of second substrates 20 and 30 are prepared (step S10 in FIG. 8). The first substrate 10 has regions corresponding to a plurality of quartz crystal resonators 100; the second substrates 20, which is one of the second substrates, has regions corresponding to a plurality of lid members 200;

and the second substrate 30, which is another of the second substrates, has regions corresponding to a plurality of base members 300. The first substrate 10 and the second substrates 20 and 30 have substantially the same outer shape in plan view as seen in the thickness direction. It is possible to obtain a plurality of quartz crystal units 1 by cutting the substrates into individual units after joining the substrates to each other. For convenience of description, elements that are included in the substrates before being cut into the plurality of individual quartz crystal units 1 and that do not change after the substrates have been cut will be described by using the same terms and the same numerals.

The first substrate 10 is a substrate for forming a plurality of quartz crystal resonators 100. As the material of the first substrate 10, the aforementioned materials of the quartz crystal resonator 100 can be used. For example, a quartz crystal substrate that is obtained by cutting out a quartz crystal material from a rough stone of an artificial quartz crystal or a natural quartz crystal at a predetermined cut angle can be used. As the material of each of the second substrates 20 and 30, the aforementioned materials of the lid member 200 and the base member 300 can be used. For example, the first substrate 10 and the second substrates 20 and 30 each may be a quartz crystal. In this case, these substrates may be quartz crystal substrates having the same cut angle (for example, AT-cut).

Various processes, such as photolithography, etching, film deposition, and the like are performed on predetermined regions of the first substrate 10, thereby forming the quartz crystal blank 110 of the quartz crystal resonator 100 described above; the frame body 120 that surrounds the outer periphery of the quartz crystal blank 110; the coupling members 111a and 111b that couple the quartz crystal blank 110 and the frame body 120 to each other; and various electrodes, including the pair of first excitation electrode 130 and second excitation electrode 140 and the extension electrodes 132 and 142.

Figure 9A:
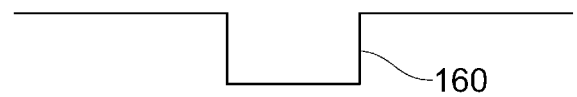
FIGS. 9(A) to 9(C) illustrate the method of manufacturing the quartz crystal unit according to the first exemplary embodiment.
Figure 9B:
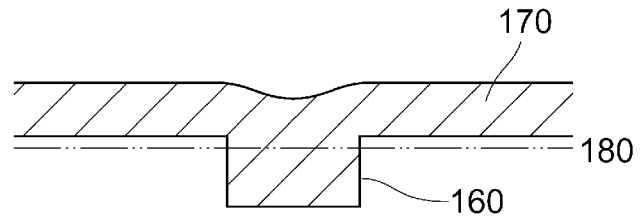
Figure 9C:
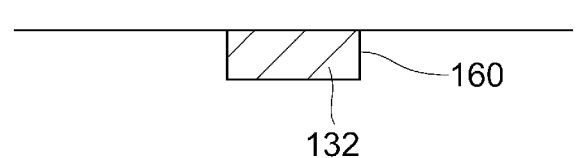

Referring to FIGS. 9(A) to 9(C), a step of forming an extension electrode on the first substrate 10 will be described in detail. FIGS. 9(A) to 9(C) illustrate, as an example of the step of forming an extension electrode, an operation performed on the first surface 122 (junction region) of the frame body 120.

First, the recess 160 is formed in the frame body 120 of the first substrate 10 by photolithography and etching (FIG. 9(A)). Next, a film of an electroconductive material 170 is formed by sputtering or the like on a region including the recess 160 to cover the recess 160 (FIG. 9(B)). As illustrated in the figure, the entirety of the surface in which the recess 160 is formed may be covered with the electroconductive material 170. Alternatively, the electroconductive material 170 may be disposed in at least the recess 160, and may be disposed only in the recess 160. Next, over the entirety of the surface in which the recess 160 has been formed, the electroconductive material 170 is polished to an imaginary line 180 where the frame body 120, formed in the first substrate 10, is exposed and the electroconductive material 170 is left in the recess 160. In this case, together with the electroconductive material 170, the surface of the quartz crystal substrate around the recess 160 may be polished. The polishing step may be performed by CMP (chemical mechanical polishing) method. Thus, the extension electrode 132, which is made of the electroconductive material 170, is formed in the recess 160, and the surface roughness of the substrate surface can be adjusted. In this way, it is possible to form the extension electrode 132, which has a thickness that does not exceed the depth of the recess 160, in the recess 160 (FIG. 9(C)). The method of forming the recess and the extension electrode is applicable in the same way to the extension electrode 142 on the second surface 124 side of the frame body 120.

When the first substrate 10 and the second substrates 20 and 30 are quartz crystal substrates, in order to smooth the surfaces, preferably, the junction region of the first substrate 10 is polished so that the root-mean-square surface roughness (Rms) of the junction region becomes less than 1 nm after being polished.

Preferably, the depth of the recess is 0.05 µm or more and 0.5 µm or less. This is because, if the recess is deeper than 0.5 µm, the entirety of the inside of the recess may not be filled with the electroconductive material when forming a film of the electroconductive material, a depression may be formed in the surface of the extension electrode after polishing, and the depression may cause cracking.

In the present embodiment, a method of forming the recess 160 and the extension electrode 132 in the first substrate 10 has been described. However, a substrate in which the recess and the extension electrode are formed is not limited to the first substrate 10. The recess and the extension electrode may be formed only in the second substrates 20 and 30 or any substrates as shown in an embodiment described below.

In the present embodiment, the extension electrode is formed by forming a recess and then forming a film of the electroconductive material in the recess. However, the method of forming the extension electrode in the recess is not limited to this. To be specific, it is sufficient that the thickness of the extension electrode does not exceed the depth of the recess when the substrates are joined to each other and that the extension electrode is accommodated in the recess when the substrates are joined to each other. For example, the recess may be formed in the junction region of the frame body of the first substrate, and the extension electrode may be formed in a region of the second substrate corresponding to the recess when the substrates are joined to each other. Conversely, the extension electrode may be formed in the junction region of the frame body of the first substrate, and the recess may be formed in a region of the second substrate corresponding to the extension electrode when the substrates are joined to each other.

The plurality of second substrates 20 and 30 are respectively substrates for forming the lid member 200 and the base member 300. When the second substrates 20 and 30 are quartz crystal substrates, preferably, the surfaces of the junction regions with the first substrate 10 are polished so as to have a root-mean-square surface roughness (Rms) of less than 1 nm. In this case, the joining area is increased, and the joining strength is increased. Moreover, a stress that acts on the junction region when the quartz crystal unit receives an external force can be reduced. The method described above can be used when forming the recess and the extension electrode in the second substrates 20 and 30.

Next, a stack member 1000 is obtained by joining the second substrate 20 to the upper surface of the first substrate 10 (the side on which the first excitation electrode 130 is formed on the quartz crystal blank 110) and joining the second substrate 30 to the lower surface of the first substrate 10 (the side on which the second excitation electrode 140 is formed on the quartz crystal blank 110) (step S11 in FIG. 8).

As illustrated in FIG. 10, the second substrate 20, the first substrate 10, and the second substrate 30 are stacked in this order in the Y' axis direction and joined to each other. At this time, the second substrates 20 and 30 are joined to the entire peripheries of the respective surfaces of the frame body 120 of the first substrate 10. By joining the second substrates 20 and 30 in this way, a plurality of quartz crystal blanks 110 of the first substrate 10 are hermetically sealed. In the present embodiment, since each of the substrates is a quartz crystal substrate, the joining force due to intermolecular force is increased, and the sealability is further improved. Moreover, because joining is performed without using a joining member, increase in the number of components can be suppressed.

In step S11, the first substrate 10 and the second substrates 20 and 30 may be joined to each other by applying a pressure of 1.7 MPa or more.

The temperature environment in step S11 may be a heating atmosphere of, for example, 400 degrees or more and 550 degrees or less.

The air pressure in step S11 may be a pressure lower than the atmospheric pressure (1.013×105 Pa) or may be a vacuum atmosphere. In this case, compared with a case where the substrates are joined to each other in an atmosphere having a pressure that is higher than or equal to the atmospheric pressure, it is easy to reduce the pressure in the sealed space in the quartz crystal unit. By making the pressure in the sealed space be lower than the atmospheric pressure, a suction force between the first substrate 10 and the second substrates 20 and 30 can be obtained. Thus, the joining force between the first substrate 10 and the second substrates 20 and 30 can be increased. Moreover, the effect of oxidation of a metal material in the sealed space can be reduced. The predetermined pressing and heating described above may be performed, for example, for about one hour. Preferably, immediately before performing step S11, the surfaces of the substrates are cleaned by washing the surfaces with ozone water or the like.

Next, a plurality of individual units are obtained by cutting the stack member 1000 (step S12 in FIG. 8).

Figure 11:
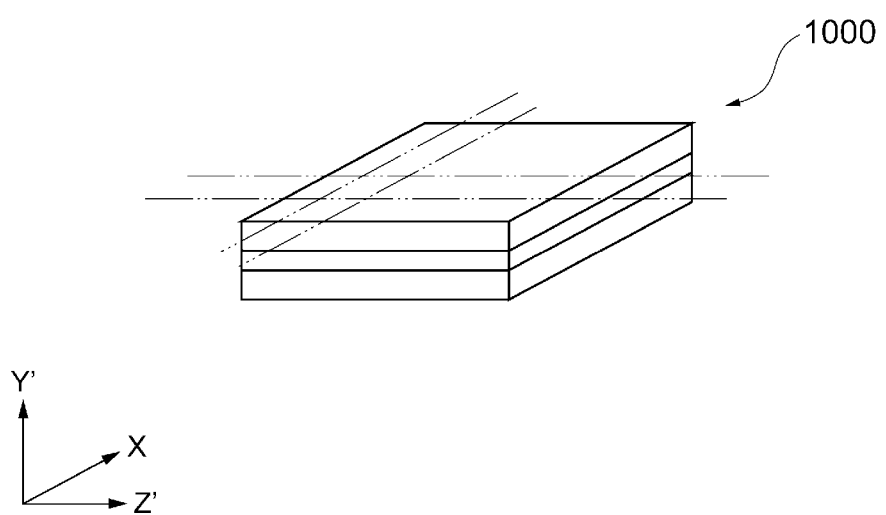
FIG. 11 is a perspective view of a stack member, illustrating the method of manufacturing the quartz crystal unit according to the first exemplary embodiment.

As illustrated in FIG. 11, the stack member 1000 is cut in the Y' axis direction by dicing or wire cutting to be divided into individual quartz crystal units.

Subsequently, outer electrodes are formed on each quartz crystal unit (step S13 in FIG. 8).

The outer electrodes are formed, by performing an appropriate combination of, for example, sputtering, vacuum deposition, and plating, on the end surfaces of the quartz crystal unit (the end surfaces of the quartz crystal resonator 100, the lid member 200, and the base member 300) and the bottom surface (the surface of the base member 300 opposite to the quartz crystal resonator 100). By forming the outer electrodes, the quartz crystal unit is provided with mountability.

In step S13, an outer electrode may be formed on an end surface of the quartz crystal unit in such a way that the outer electrode covers at least a part of the boundary between the quartz crystal resonator, the lid member, or the base member and the extension electrode extending to the end surface. In this case, the sealability is further increased, because the boundary between the extension electrode and the quartz crystal resonator, the lid member, or the base member, which is made of a material different from that of the extension electrode, is covered with the outer electrode.

Figure 12:
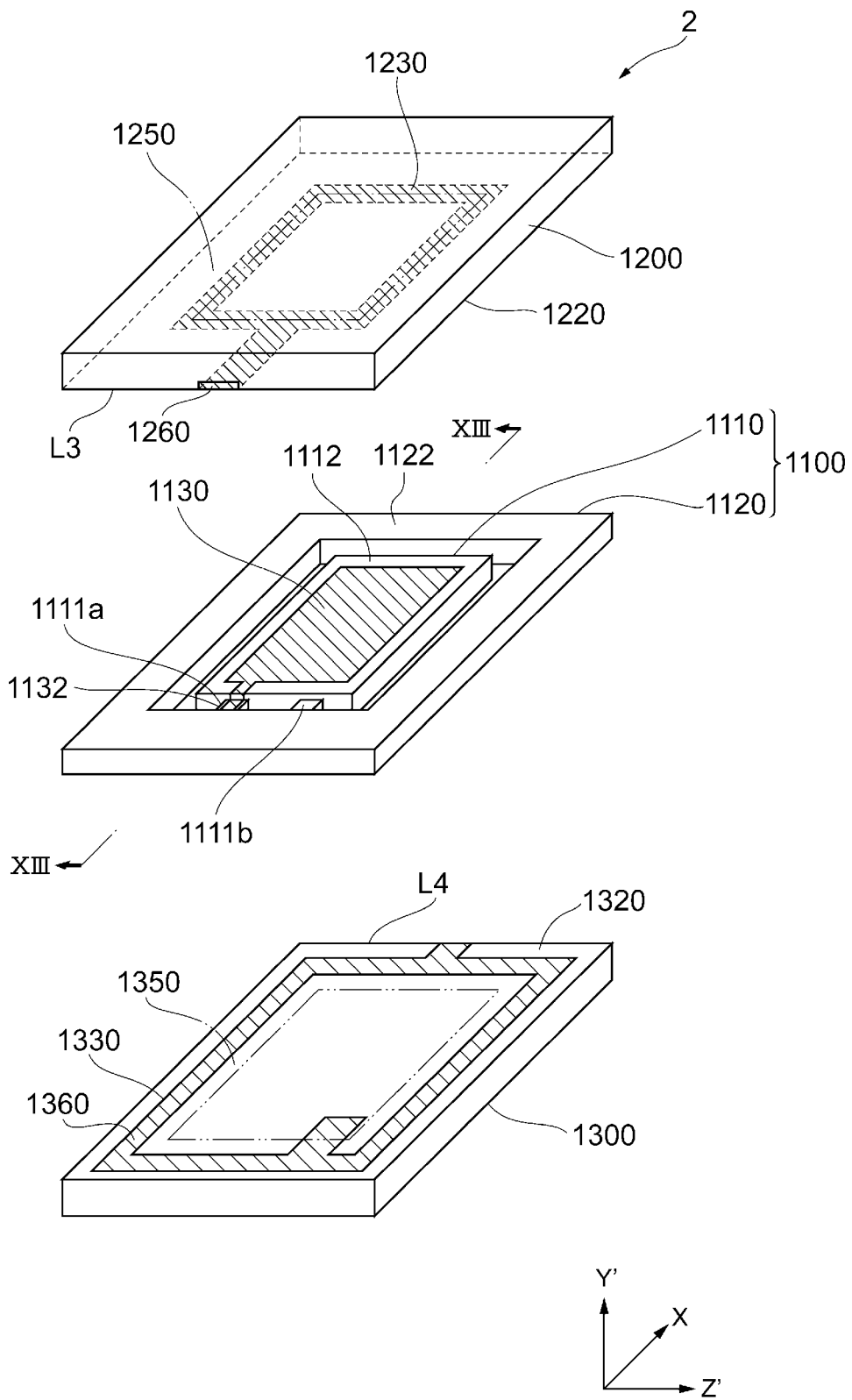
FIG. 12 is an exploded perspective view of a quartz crystal unit according to a modification of the first exemplary embodiment.
Figure 13:
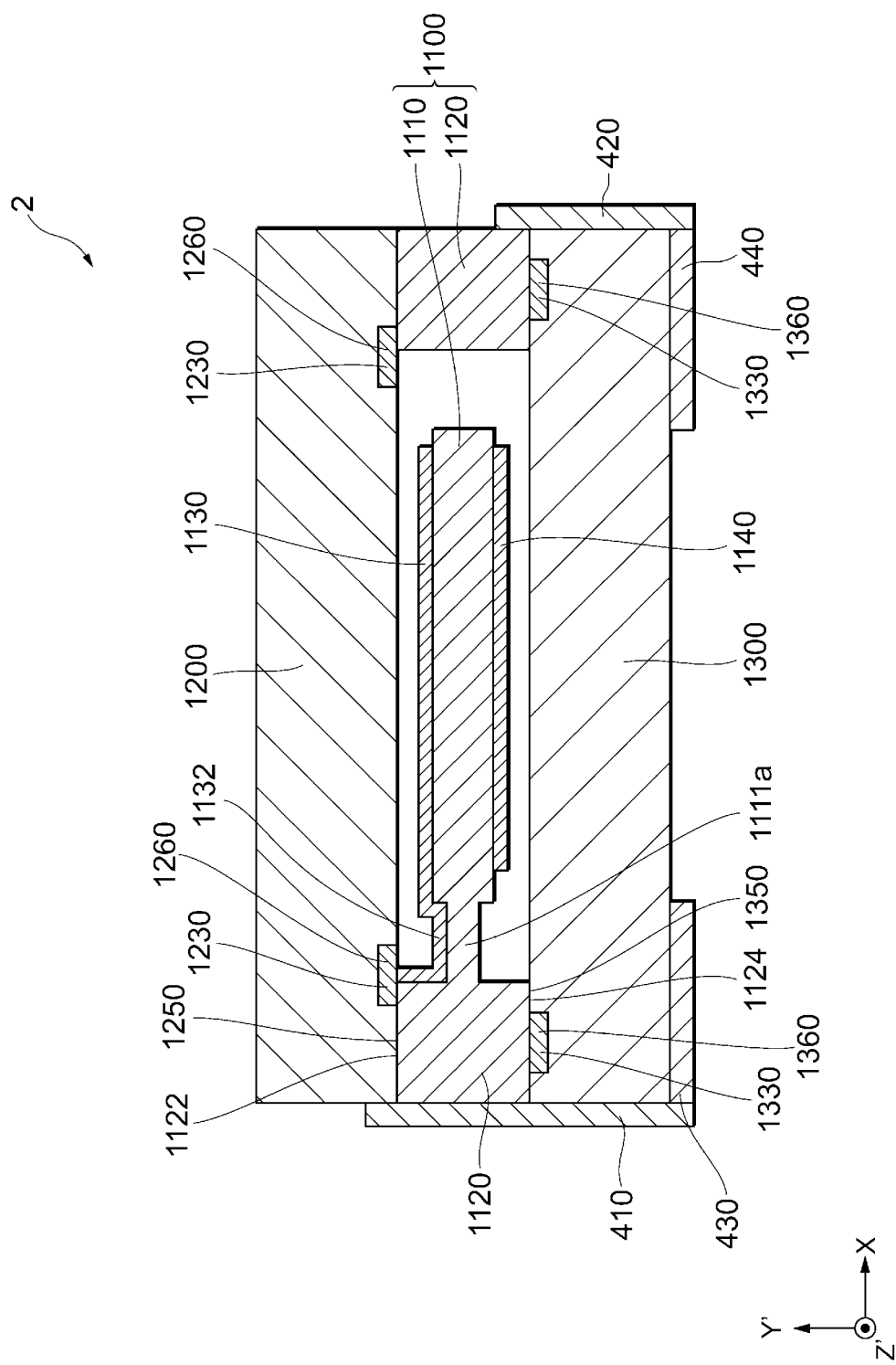
FIG. 13 is a sectional view taken along line XIII-XIII of FIG. 12.

Next, referring to FIGS. 12 and 13, a quartz crystal unit according to a modification of the first embodiment will be described. FIG. 12 is an exploded perspective view of a quartz crystal unit according to the modification of the first embodiment. FIG. 13 is a sectional view taken along line XIII-XIII of FIG. 12. The modification described below differs from the embodiment described above in that extension electrodes and recesses, which accommodate the extension electrodes, are formed in a lid member and a base member, which are package members. In the following description, only the difference will be described. The same applies to other embodiments.

As illustrated in FIGS. 12 and 13, a quartz crystal unit (a quartz crystal unit 2) according to the present embodiment includes a quartz crystal resonator 1100; a lid member 1200; a base member 1300; and outer electrodes 410, 420, 430, and 440.

As with the quartz crystal resonator 100, the quartz crystal resonator 1100 includes a first excitation electrode 1130, which is formed on a first surface 1112 of a quartz crystal blank 1110, and an extension electrode 1132, which is electrically connected to the first excitation electrode 1130. The extension electrode 1132 extends from the first excitation electrode 1130 through a coupling member 1111a toward a first surface 1122 of a frame body 1120. However, the extension electrode 1132 does not protrude from the first surface 1122 and has an end surface on the first surface 1122 (see FIG. 13).

The lid member 1200 includes an extension electrode 1230 and a recess 1260 that accommodates the extension electrode 1230. The base member 1300 includes an extension electrode 1330 and a recess 1360 that accommodates the extension electrode 1330. In the present embodiment, the extension electrode 1230 and the recess 1260 are formed in a surface (surface on the negative Y' side) 1220 of the lid member 1200 including a junction region 1250 with the quartz crystal resonator 1100 so as to surround the entire periphery of the surface (see FIG. 12). The extension electrode 1330 and the recess 1360 are formed in a surface (surface on the positive Y' side) 1320 of the base member 1300 including a junction region 1350 with the quartz crystal resonator 1100 so as to surround the entire periphery of the surface (see FIG. 12). Thus, the extension electrode 1230 is electrically connected, in the junction region 1250, to the extension electrode 1132 (which is electrically connected to the first excitation electrode 1130) of the quartz crystal resonator 1100 (see FIG. 13). The extension electrode 1330 is electrically connected, in the junction region 1350, to the extension electrode (which is electrically connected to a second excitation electrode 1140) of the quartz crystal resonator 1100. The extension electrode 1330 is formed on the surface 1320 so as to extend in the positive X direction in a region corresponding to the extension electrode extending to a coupling member 1111b of the quartz crystal resonator 1100 (see FIG. 12).

The extension electrode 1230 extends so as to come into contact with an edge L3 of the surface 1220 on the negative X side. The extension electrode 1330 extends so as to come into contact with an edge L4 of the surface 1320 on the positive X side (see FIG. 12). Thus, it is possible to provide, at each of the edges that face each other in the X axis direction, an outer electrode that is electrically connected to a corresponding one of the extension electrodes 1230 and 1330. The direction in which the extension electrodes 1230 and 1330 extend is not limited to the X axis direction. The direction may be, for example, the Z' axis direction, or may be appropriately changed in accordance with the positions where the outer electrodes are formed.

Detailed description of the outer electrodes 410, 420, 430, and 440, which are the same as those of the quartz crystal unit 1 shown in FIG. 2, will be omitted.

Also with the structure described above, the extension electrode 1230 and the extension electrode 1330 can be formed so as not to protrude, respectively, from the surface 1220 of the lid member 1200 (including the junction region 1250 with the quartz crystal resonator 1100) and the surface 1320 of the base member 1300 (including the junction region 1350 with the quartz crystal resonator 1100). Accordingly, it is possible to keep the junction regions of the lid member 1200 and the base member 1300 with the frame body 1120 smooth, and it is possible to suppress reduction in the joining strength between the frame body 1120 and the lid member 1200 and the base member 1300 due to protrusion of the extension electrodes in the thickness direction in the junction regions. Accordingly, it is possible to provide sufficient hermeticity for the quartz crystal blank 1110 and to improve the reliability of the quartz crystal unit 2.

When forming the extension electrodes 1230 and 1330 in the lid member 1200 and the base member 1300, for example, in step S10 of preparing the second substrates 20 and 30 shown in FIG. 8, the recesses and the extension electrodes are formed in the second substrates 20 and 30 by using the method described above.

Figure 14:
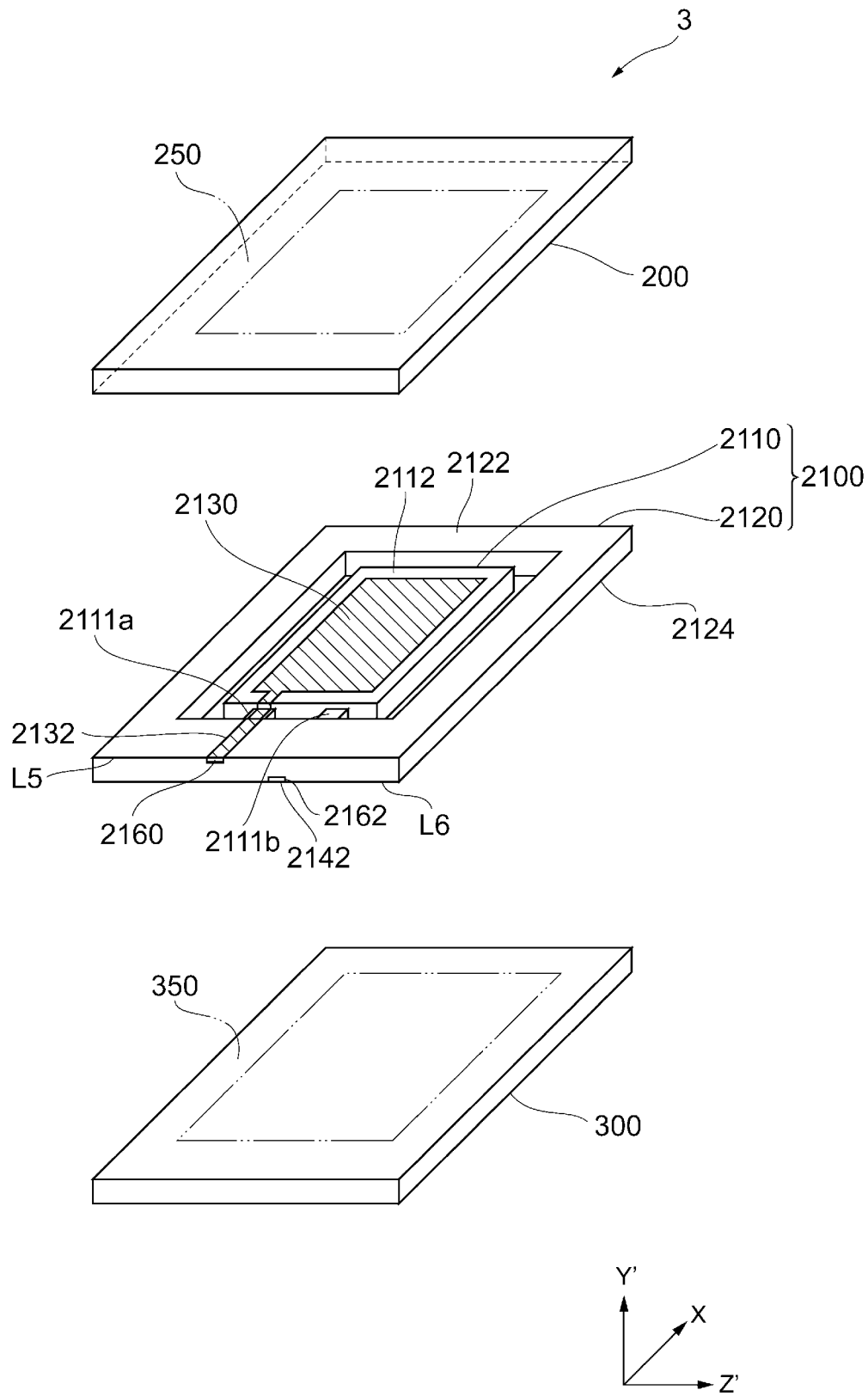
FIG. 14 is an exploded perspective view of a quartz crystal unit according to a second exemplary embodiment.
Figure 15:
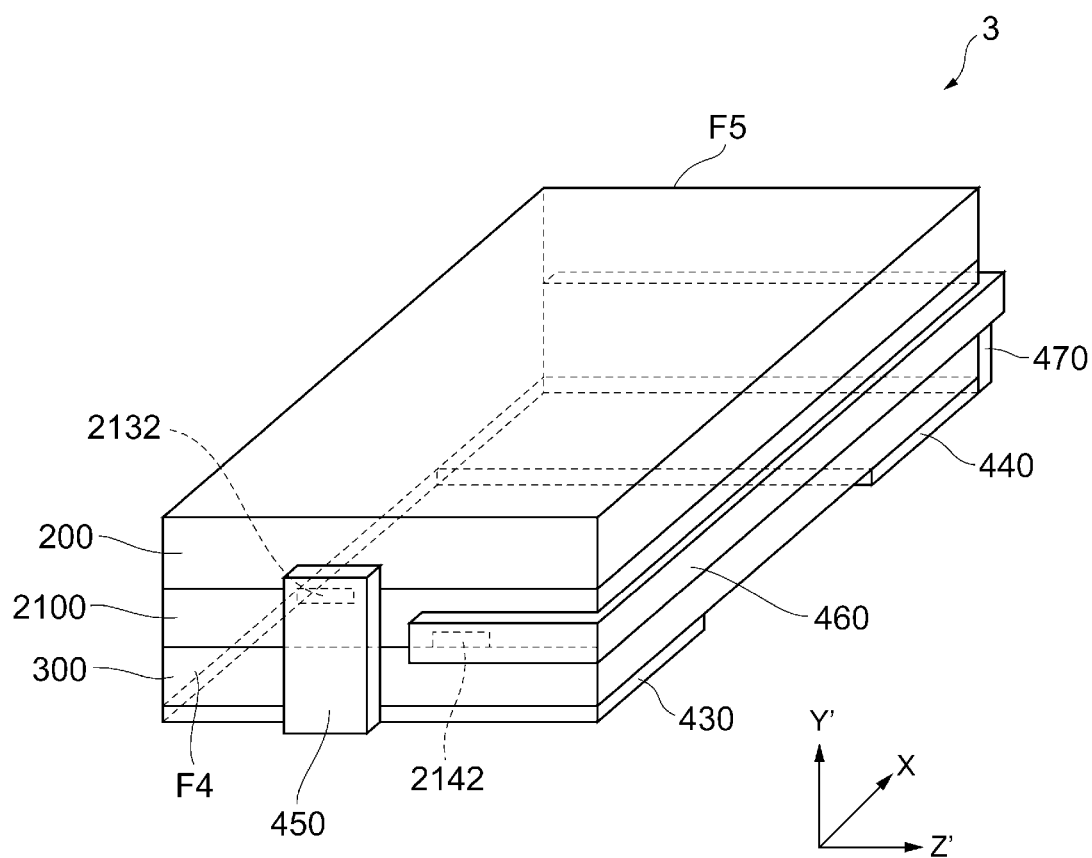
FIG. 15 is a perspective view of the quartz crystal unit according to the second exemplary embodiment.

Next, referring to FIGS. 14 and 15, a quartz crystal unit according to a second exemplary embodiment will be described. FIG. 14 is an exploded perspective view of the quartz crystal unit according to the second exemplary embodiment. FIG. 15 is a perspective view of the quartz crystal unit according to the second exemplary embodiment. In the present embodiment, the structures of the extension electrodes and the outer electrodes differ from those of the quartz crystal unit 1 according to the first embodiment.

As illustrated in FIGS. 14 and 15, a quartz crystal unit (a quartz crystal unit 3) according to the present embodiment includes a quartz crystal resonator 2100; a lid member 200; a base member 300; and outer electrodes 430, 440, 450, 460, and 470.

The quartz crystal resonator 2100 differs from the quartz crystal resonator 100 in the structures of the extension electrodes. An extension electrode 2132 of the quartz crystal resonator 2100 extends from a first excitation electrode 2130 through a coupling member 2111a onto a first surface 2122 of a frame body 2120 and extends so as to come into contact with an edge L5 of the surface on the positive X side (see FIG. 14). Likewise, on the second excitation electrode side, an extension electrode 2142 extends from the second excitation electrode through a coupling member 2111b onto a second surface 2124 of the frame body 2120 and extends so as to come into contact with an edge L6 of the surface on the negative X side. Thus, it is possible to provide an outer electrodes that is electrically connected to a corresponding one of the extension electrodes 2132 and 2142. The direction in which the extension electrodes 2132 and 2142 extend is not limited to the X axis direction. The direction may be, for example, the Z' axis direction, or may be appropriately changed in accordance with the positions where the outer electrodes are formed.

Detailed description of the lid member 200 and the base member 300, which are the same as those of the quartz crystal unit 1, will be omitted.

Next, referring to FIG. 15, the structures of the outer electrodes will be described. In the present embodiment, the extension electrodes 2132 and 2142 extend toward the same surface (an end surface F4 of the quartz crystal unit 3 on the negative X side). Therefore, one of the extension electrodes (for example, the extension electrode 2142) is guided by the outer electrodes 460 and 470 so as to extend toward the opposite surface (an end surface F5 of the quartz crystal unit 3 on the positive X side). To be specific, as with the outer electrode 410, the outer electrode 450 is disposed on the surface F4, which is an end surface of the quartz crystal unit 3 on the negative X side to which the extension electrode 2132 extends, in such a way that the outer electrode 450 covers at least a part (in the quartz crystal unit 3, the entirety) of the boundary between the quartz crystal resonator 2100 or the lid member 200 and the extension electrode 2132 (see FIG. 15). The outer electrode 460 is disposed on the surface F4, which is an end surface of the quartz crystal unit 3 on the negative X side to which the extension electrode 2142 extends, in such a way that the outer electrode 460 covers at least a part (in the quartz crystal unit 3, the entirety) of the boundary between the quartz crystal resonator 2100 or the base member 300 and the extension electrode 2142. However, the outer electrode 460 is guided along an end surface of the quartz crystal unit 3 so as to extend to the surface F5 on the positive X side (see FIG. 15). The outer electrode 470 is formed on the surface F5 so as to be electrically connected to the outer electrode 460 (see FIG. 15). The outer electrodes 430 and 440 do not differ from those of the quartz crystal unit 1. Also with such a structure, by applying an alternative-current voltage between the pair of first and second excitation electrodes of the quartz crystal resonator 2100 via the outer electrodes 450 and 430 on one side and the outer electrodes 460, 470, and 440 on the other side of the quartz crystal unit 3, it is possible to cause a quartz crystal blank 2110 to vibrate in a predetermined vibration mode, such as a thickness shear mode, and to obtain resonance characteristics due to the vibration.

Preferably, the outer electrodes 450 and 460 cover the entirety of the boundaries of the extension electrodes 2132 and 2142 extending to the surface F4. In this case, compared with a case where only a part of the boundaries is covered, the area of the boundaries covered by the outer electrodes is increased, and the sealability is further improved.

Also with such a structure, because the extension electrodes 2132 and 2142 are disposed in recesses 2160 and 2162, the extension electrodes 2132 and 2142 can be formed without protruding from the junction region of the frame body 2120. Accordingly, it is possible to keep the junction region smooth, and it is possible to suppress reduction in the joining strength between the frame body 2120 and the lid member 200 and the base member 300 due to protrusion of the extension electrodes in the thickness direction in the junction region. Accordingly, it is possible to provide sufficient hermeticity for the quartz crystal blank 2110 and to improve the reliability of the quartz crystal unit 3.

Figure 16:
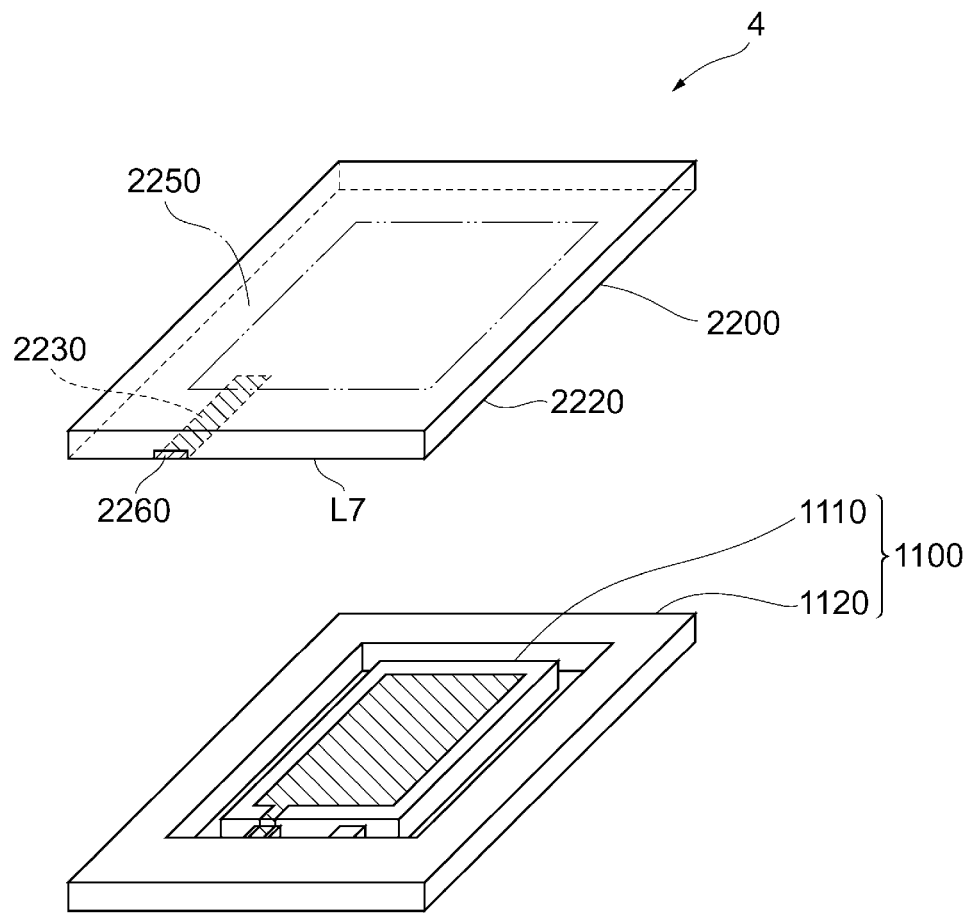
FIG. 16 is an exploded perspective view of a quartz crystal unit according to a modification of the second exemplary embodiment.
Figure 16:
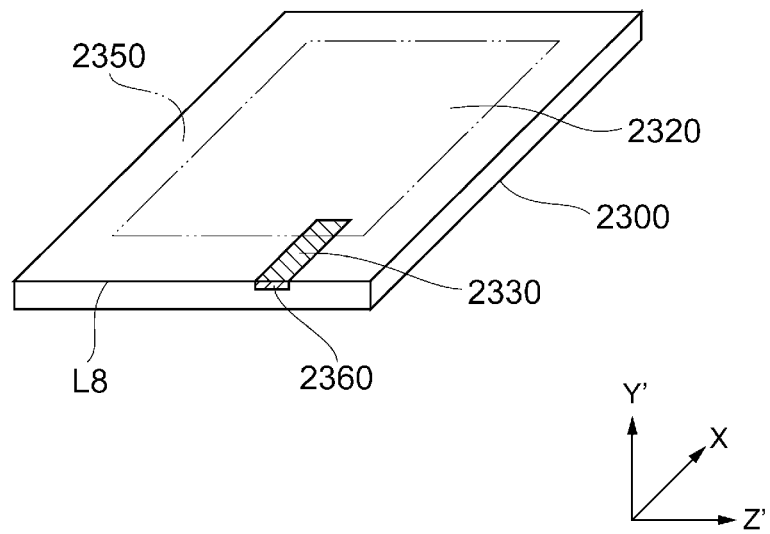

Next, referring to FIG. 16, a quartz crystal unit according to a modification of the second exemplary embodiment will be described. FIG. 16 is an exploded perspective view of the quartz crystal unit according to the modification of the second exemplary embodiment. The modification differs from the embodiments described above in that extension electrodes and recesses, which accommodate the extension electrodes, are formed in a lid member and a base member, which are package members.

As illustrated in FIG. 16, a quartz crystal unit (a quartz crystal unit 4) according to the present embodiment includes a quartz crystal resonator 1100, a lid member 2200, a base member 2300, and outer electrodes (not shown).

The quartz crystal resonator 1100 is the same as that of the quartz crystal unit 2 described above (see FIG. 12). Detailed description and illustration of the outer electrodes, which are the same as those of the quartz crystal unit 3 described above (see FIG. 15), will be omitted.

The lid member 2200 includes an extension electrode 2230 and a recess 2260 that accommodates the extension electrode 2230. The base member 2300 includes an extension electrode 2330 and a recess 2360 that accommodates the extension electrode 2330. In the present embodiment, the extension electrode 2230 and the recess 2260 are formed in a surface (surface on the negative Y' side) 2220 of the lid member 2200 including a junction region 2250 with the quartz crystal resonator 1100, and, in the junction region 2250, electrically connected to an extension electrode (which is electrically connected to the first excitation electrode) of the quartz crystal resonator 1100. The extension electrode 2330 and the recess 2360 are formed in a surface (surface on the positive Y' side) 2320 of the base member 2300 including a junction region 2350 with the quartz crystal resonator 1100, and, in the junction region 2350, electrically connected to an extension electrode (which is electrically connected to the second excitation electrode) of the quartz crystal resonator 1100.

The extension electrode 2230 extends so as to come into contact with an edge L7 of the surface 2220 on the negative X side. The extension electrode 2330 extends so as to come into contact with an edge L8 of the surface 2320 on the positive X side (see FIG. 16). Thus, it is possible to provide an outer electrode that is electrically connected to a corresponding one of the extension electrodes 2230 and 2330. The direction in which the extension electrodes 2230 and 2330 extend is not limited to the negative X axis direction. The direction may be, for example, the Z' axis direction, or may be appropriately changed in accordance with the positions where the outer electrodes are formed.

Also with such a structure, by applying an alternative-current voltage between the pair of first and second excitation electrodes of the quartz crystal resonator 1100 via the outer electrodes, it is possible to cause the quartz crystal blank 1110 to vibrate in a predetermined vibration mode, such as a thickness shear mode, and to obtain resonance characteristics due to the vibration.

Because the extension electrodes 2230 and 2330 are disposed in the recesses 2260 and 2360, the extension electrodes 2230 and 2330 can be formed without protruding from the junction region 2250 of the lid member 2200 and the junction region 2350 of the base member 2300 (the junction regions with the quartz crystal resonator 1100). Accordingly, it is possible to keep the junction regions smooth, and it is possible to suppress reduction in the joining strength between the frame body 1120 and the lid member 2200 and the base member 2300 due to protrusion of the extension electrodes in the thickness direction in the junction regions. Accordingly, it is possible to provide sufficient hermeticity for the quartz crystal blank 1110 and to improve the reliability of the quartz crystal unit 4.

Figure 17:
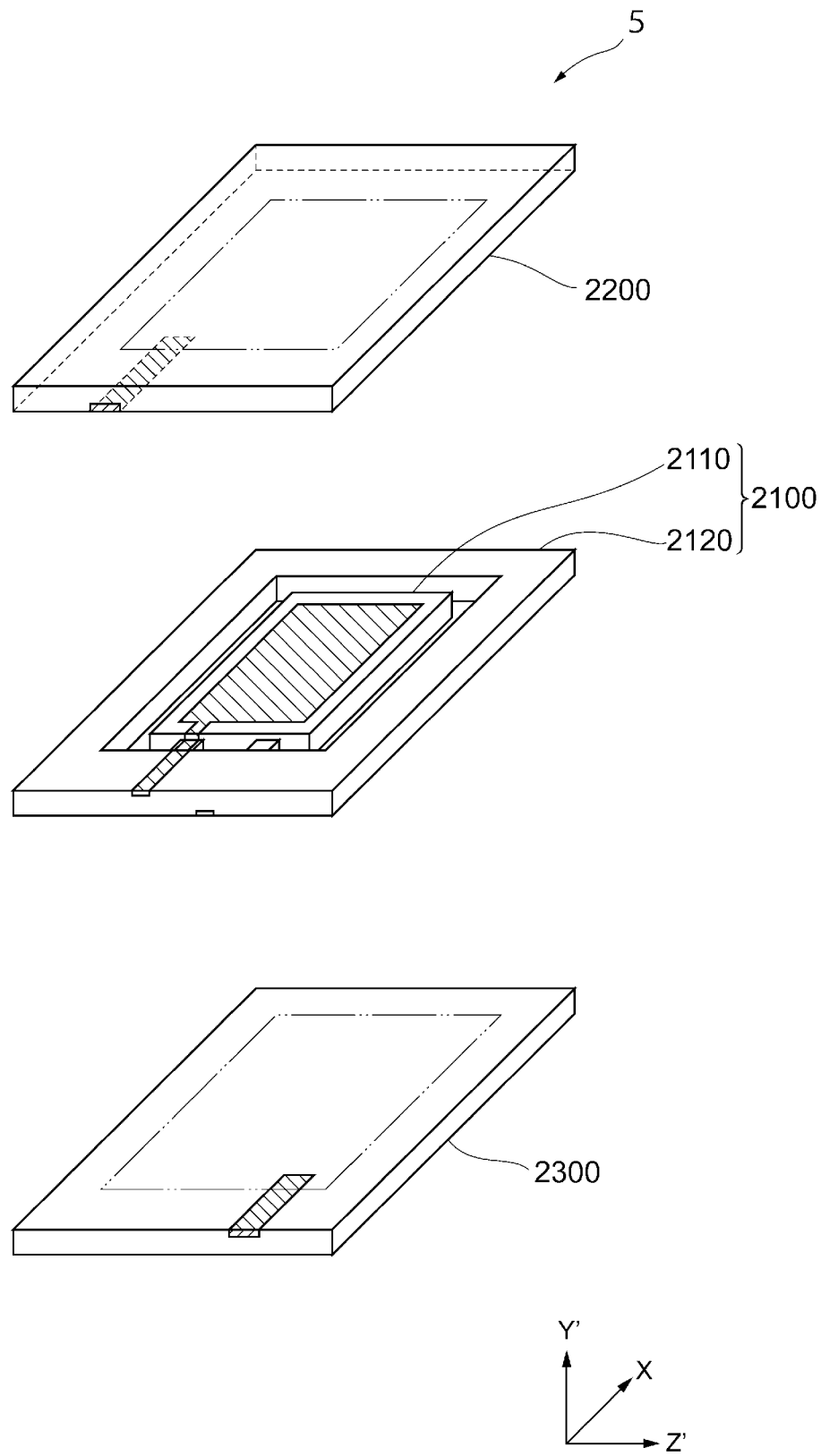
FIG. 17 is an exploded perspective view of a quartz crystal unit according to another modification of the second exemplary embodiment.

Next, referring to FIG. 17, a quartz crystal unit according to another modification of the second exemplary embodiment will be described. FIG. 17 is an exploded perspective view of the quartz crystal unit according to the other modification of the second exemplary embodiment. The modification differs from the embodiments described above in that an extension electrode and a recess, which accommodates the extension electrode, are formed in each of a quartz crystal resonator, a lid member, and a base member.

As illustrated in FIG. 17, a quartz crystal unit (a quartz crystal unit 5) according to the present embodiment includes a quartz crystal resonator 2100, a lid member 2200, a base member 2300, and outer electrodes (not shown). Detailed description and illustration of the outer electrodes, which are the same as those of the quartz crystal unit 3 described above (see FIG. 15), will be omitted.

Also with such a structure, because the extension electrode of each of the frame body 2120, the lid member 2200, and the base member 2300 are disposed in a corresponding one of the recesses, it is possible to keep the junction regions smooth, and it is possible to suppress reduction in the joining strength. Accordingly, it is possible to provide sufficient hermeticity for the quartz crystal blank 2110 and to improve the reliability of the quartz crystal unit 5.

Heretofore, exemplary embodiments have been described. In each of the quartz crystal units 1 to 5, a recess is formed in a junction region of at least one of the frame body and the package member (the lid member or the base member) of the quartz crystal resonator, the junction region being a region where the frame body and the package member are joined to each other, and, in the junction region, the extension electrode is disposed in the recess in such a way that the extension electrode has a thickness that does not exceed a depth of the recess. Thus, it is possible to keep the junction region smooth and to suppress decrease of the joining strength. Accordingly, it is advantageously possible to provide sufficient hermeticity for a quartz crystal blank and to improve the reliability of the quartz crystal unit.

In each of the quartz crystal units 1 to 5 as described herein, the extension electrode may extend to end surfaces of the quartz crystal resonator and the package member, and the quartz crystal unit may further include an outer electrode that is electrically connected to the extension electrode. In this case, by applying an alternative-current voltage between a pair of first excitation electrode and second excitation electrode of the quartz crystal resonator via the outer electrode, it is possible to cause the quartz crystal blank to vibrate in a predetermined vibration mode, such as a thickness shear mode, and to obtain resonance characteristics due to the vibration.

Moreover, in each of the quartz crystal units 1 to 5, the outer electrode may be formed on the end surfaces of the quartz crystal resonator and the package member in such a way that the outer electrode covers at least a part of a boundary between the quartz crystal resonator or the package member and the extension electrode. In this case, the sealability is further increased.

In each of the quartz crystal units 1 to 5, the depth of the recess may be 0.05 μm or more and 0.5 μm or less according to exemplary aspects. In this case, the entirety of the inside of the recess is filled with the extension electrode, and occurrence of cracking of the quartz crystal unit can be suppressed.

In each of the quartz crystal units 1 to 5, an end surface the quartz crystal resonator, an end surface of the package member, and an end surface of the extension electrode may be flush with each other. In this case, entry of foreign substances, such a dust, into the quartz crystal unit and occurrence of cracking of the quartz crystal unit can be suppressed.

In each of the quartz crystal units 1 to 5, the package member may be made of a quartz crystal. For example, the quartz crystal resonator and the package member may each be made of an AT-cut quartz crystal. In this case, the quartz crystal resonator and the package member can be directly joined to each other. Accordingly, the joining strength of the junction regions is improved, and it is possible to provide sufficient hermeticity for the quartz crystal blank and to improve the reliability of the quartz crystal unit.

In each of the quartz crystal units 1 to 5, a root-mean-square surface roughness (Rms) of the junction region of each of the frame body of the quartz crystal resonator and the package member may be less than 1 nm. In this case, when the members are directly joined to each other, the joining force due to intermolecular force is increased, and the sealability is further improved.

In each of the quartz crystal units 1 to 5, preferably, the package member includes a lid member and a base member, and the lid member and the base member are each joined to the entire periphery of the frame body of the quartz crystal resonator. In this case, the quartz crystal blank is hermetically sealed in an inner space by the lid member and the base member.

A method of manufacturing a quartz crystal unit according to the present embodiment includes (a) preparing a first substrate for forming a plurality of quartz crystal resonators, the first substrate being made of a quartz crystal, each of the quartz crystal resonators including a quartz crystal blank on which a pair of excitation electrodes that face each other are formed, a frame body that surrounds an outer periphery of the quartz crystal blank, and a coupling member that couples the quartz crystal blank and the frame body to each other; (b) preparing a second substrate for forming a plurality of package members; and (c) joining the first substrate and the second substrate to each other in such a way that the package member is joined to an entire periphery of the frame body on at least one side of the pair of excitation electrodes. In at least one of (a) and (b), a recess is formed in a junction region of at least one of the frame body and the package member, the junction region being a region where the frame body and the package member are joined to each other, and an extension electrode that is electrically connected to one of the pair of excitation electrodes is disposed in the recess in such a way that the extension electrode has a thickness that does not exceed a depth of the recess in the junction region. Thus, it is possible to keep the junction region smooth and to suppress decrease of the joining strength. Accordingly, it is possible to provide sufficient hermeticity for the quartz crystal blank and to manufacture a quartz crystal unit having an improved reliability.

The recess may be formed in the junction region of the frame body of the quartz crystal resonator, and the extension electrode may be formed in the recess. Alternatively, the recess may be formed in the junction region of the package member, and the extension electrode may be formed in the recess. The recess may be formed in the junction region of the frame body of the quartz crystal resonator, and the extension electrode may be formed in a region of the junction region of the package member, the region corresponding to the recess. The extension electrode may be formed in the junction region of the frame body of the quartz crystal resonator, and the recess may be formed in a region of the junction region of the package member, the region corresponding to the extension electrode.

Forming the extension electrode may include forming a film of an electroconductive material on a region of the frame body of the quartz crystal resonator or the package member, the region including the recess, and forming the extension electrode in the recess by polishing the electroconductive material until the frame body of the quartz crystal resonator or the package member is exposed and leaving the electroconductive material in the recess.

When the second substrate is made of a quartz crystal, preferably, in order to smooth the surfaces of the frame body of the quartz crystal resonator and the package member, the junction region of each of the frame body of the quartz crystal resonator and the package member is polished so as to have a root-mean-square surface roughness (Rms) of less than 1 nm. In this case, when the members that are made of the same quartz crystal material are directly joined to each other, the joining force due to intermolecular force is increased, and the sealability is further improved.

In an exemplary aspect, during the step of joining the first substrate and the second substrate, the first substrate and the second substrate may be joined to each other by applying a pressure of 1.7 MPa or more in a heating atmosphere of 400 degrees or more and 550 degrees or less.

In an exemplary aspect, during the step of joining the first substrate and the second substrate, preferably, the joining is performed in an atmosphere having a pressure lower than an atmospheric pressure. In this case, compared with a case where the substrates are joined to each other in an atmosphere having a pressure that is higher than or equal to the atmospheric pressure, it is easy to reduce the pressure in the sealed space in the quartz crystal unit. By making the pressure in the sealed space be lower than the atmospheric pressure, a suction force between the first substrate and the second substrate can be obtained. Thus, the joining force between the first substrate and the second substrate can be increased. Moreover, due to the depressurized atmosphere, the effect of oxidation of a metal material in the sealed space can be reduced.

In an exemplary aspect, during the step of preparing the second substrate, a plurality of the second substrates may be prepared, and the first substrate and the second substrates may be joined to each other so as to join the package member to the entire periphery of the frame body formed in the first substrate. In this case, the quartz crystal blank is hermetically sealed in an inner space by the lid member and the base member.

The method may further include cutting out the quartz crystal units from a member in which the first substrate and the second substrate are joined; and forming an outer electrode on end surfaces of the quartz crystal resonator and the package member in such a way that the outer electrode covers at least a part of a boundary between the quartz crystal resonator or the package member and the extension electrode that extends to the end surfaces of the quartz crystal resonator and the package member. In this case, the sealability is further increased, because the boundary between the extension electrode and the quartz crystal resonator, the lid member, or the base member, which is made of a material different from that of the extension electrode, is covered by the outer electrode.

In each of the exemplary embodiments (including the modifications) described above, as an example of an AT-cut quartz crystal resonator, a quartz crystal resonator having long sides parallel to the X axis and short sides parallel to the Z' axis is described. However, the exemplary aspects of the present disclosure is not limited to this. For example, the exemplary embodiments may be applied to an AT-cut quartz crystal resonator having long sides parallel to the Z' axis and short sides parallel to the X axis. Alternatively, a quartz crystal resonator that is not AT-cut (for example, BT-cut) may be used.

It is noted that each of the exemplary embodiments is described above in order to facilitate understating and does not limit the scope. The present invention can be modified/improved within the scope and sprit thereof, and the present invention includes the equivalents thereof. That is, modifications in design that are made on each of the embodiments by a person having ordinary skill in the art are included in the scope, as long as such modifications have features. For example, the dispositions, materials, shapes, and sizes of elements of the embodiments are not limited to those in the examples described above and may be changed as appropriate. Elements of the embodiments may be used in any combination as long as the combination is technologically feasible, and such combinations are within the scope as long as they include the features.

REFERENCE SIGNS LIST 1, 2, 3, 4, 5 quartz crystal unit
100, 1100, 2100 quartz crystal resonator
110, 1110, 2110 quartz crystal blank
111a, 111b, 1111a, 1111b, 2111a, 2111b coupling member
120, 1120, 2120 frame body
130, 1130, 2130 first excitation electrode
132, 142, 1132, 1230, 1330, 2132, 2142, 2230, 2330 extension electrode
134 inspection electrode
140, 1140 second excitation electrode
250, 350, 1250, 1350, 2250, 2350 junction region
200, 1200, 2200 lid member
300, 1300, 2300 base member
410, 420, 430, 440, 450, 460, 470 outer electrode
160, 162, 1260, 1360, 2160, 2162, 2260, 2360 recess

The invention claimed is:

1. A quartz crystal unit comprising:
a quartz crystal resonator including a quartz crystal blank with a pair of excitation electrodes disposed on opposing surfaces thereof, a frame body that surrounds an outer periphery of the quartz crystal blank, and at least one coupling member that couples the frame body to the quartz crystal blank;
a package member coupled to an entire periphery of the frame body on at least one side of the pair of excitation electrodes;
an extension electrode that is electrically connected to one of the pair of excitation electrodes; and
an outer electrode electrically connected to the extension electrode,
wherein a recess is disposed in a junction region of at least one of the frame body and the package member, with the junction region being where the frame body and the package member are coupled to each other,
wherein the extension electrode is disposed in the recess such that the extension electrode has a thickness that does not exceed a depth of the recess, and
wherein the extension electrode extends to end side surfaces of the quartz crystal resonator and the package member.

2. The quartz crystal unit according to claim 1, wherein the recess is formed in the junction region of the package member.

3. The quartz crystal unit according to claim 1, wherein the recess is formed in the junction region of the frame body of the quartz crystal resonator.

4. The quartz crystal unit according to claim 1, wherein the outer electrode is disposed on the end side surfaces of the quartz crystal resonator and the package member such that the outer electrode covers at least a portion of a boundary between the extension electrode and at least one of the quartz crystal resonator and the package member.

5. The quartz crystal unit according to claim 1, wherein the recess comprises a depth that is equal to or greater than 0.05 µm and equal to or less than 0.5 µm.

6. The quartz crystal unit according to claim 1, wherein the package member comprises a quartz crystal.

7. The quartz crystal unit according to claim 6, wherein the frame body of the quartz crystal resonator and the package member are directly coupled to each other at the junction region.

8. The quartz crystal unit according to claim 6, wherein the quartz crystal resonator and the package member each comprise an AT-cut quartz crystal.

9. The quartz crystal unit according to claim 6, wherein a root-mean-square surface roughness (Rms) of the junction region of each of the frame body of the quartz crystal resonator and the package member is less than 1 nm.

10. The quartz crystal unit according to claim 1, wherein the package member includes a lid member and a base, with the lid member coupled to an entire periphery of the frame body on one side of the pair of excitation electrodes, and the base member coupled to an entire periphery of the frame body on the other side of the pair of excitation electrodes.

11. The quartz crystal unit according to claim 1, wherein the extension electrode fills an entirety of an inside of the recess such that the extension electrode has a thickness that does not exceed a depth of the recess.

12. The quartz crystal unit according to claim 1, wherein the outer electrode is disposed on the end side surfaces of the quartz crystal resonator and the package member such that the outer electrode covers an entirety of a boundary between the extension electrode and at least one of the quartz crystal resonator and the package member.

13. A quartz crystal unit comprising:
a quartz crystal resonator including a quartz crystal blank with a pair of excitation electrodes disposed on opposing surfaces thereof, a frame body that surrounds an outer periphery of the quartz crystal blank, and at least one coupling member that couples the frame body to the quartz crystal blank;
a package member coupled to an entire periphery of the frame body on at least one side of the pair of excitation electrodes; and
an extension electrode that is electrically connected to one of the pair of excitation electrodes,
wherein a recess is disposed in a junction region of at least one of the frame body and the package member, with the junction region being where the frame body is coupled to the package member,
wherein the extension electrode is disposed in the recess such that the extension electrode has a thickness that does not exceed a depth of the recess, and
wherein an end side surface of the quartz crystal resonator, an end side surface of the package member, and an end side surface of the extension electrode are flush with each other.

14. A method of manufacturing a quartz crystal unit, the method comprising:
preparing a first substrate for forming a plurality of quartz crystal resonators, the first substrate being made of a quartz crystal, each of the plurality of quartz crystal resonators including a quartz crystal blank on which a pair of excitation electrodes are formed on opposing surfaces thereof, a frame body that surrounds an outer periphery of the quartz crystal blank, and at least one coupling member that couples the quartz crystal blank to the frame body;
preparing a second substrate for forming a plurality of package members;
joining the first substrate to the second substrate such that the package member is joined to an entire periphery of the frame body on at least one side of the pair of excitation electrodes;

forming a recess in a junction region of at least one of the frame body and the package member, with the junction region being where the frame body is joined to the package member;

forming an extension electrode that is electrically connected to one of the pair of excitation electrodes, wherein the extension electrode is formed in the recess such that the extension electrode has a thickness that does not exceed a depth of the recess;

cutting out the quartz crystal units from a member in which the first substrate and the second substrate are joined; and forming an outer electrode on respective end side surfaces of the quartz crystal resonator and the package member such that the outer electrode covers at least a part of a boundary between the extension electrode and at least one of the quartz crystal resonator and the package member, such that the outer electrode extends to the end side surfaces of the quartz crystal resonator and the package member.

15. The method of manufacturing a quartz crystal unit according to claim 14, further comprising forming the recess in the junction region of the frame body of the quartz crystal resonator.

16. The method of manufacturing a quartz crystal unit according to claim 14, further comprising forming the recess in the junction region of the package member.

17. A method of manufacturing a quartz crystal unit, the comprising:

preparing a first substrate for forming a plurality of quartz crystal resonators, the first substrate being made of a quartz crystal, each of the plurality of quartz crystal resonators including a quartz crystal blank on which a pair of excitation electrodes are formed on opposing surfaces thereof, a frame body that surrounds an outer periphery of the quartz crystal blank, and at least one coupling member that couples the quartz crystal blank to the frame body;

preparing a second substrate for forming a plurality of package members;

joining the first substrate to the second substrate such that the package member is joined to an entire periphery of the frame body on at least one side of the pair of excitation electrodes;

forming a recess in a junction region of at least one of the frame body and the package member, with the junction region being where the frame body is joined to the package member; and forming an extension electrode that is electrically connected to one of the pair of excitation electrodes, wherein the extension electrode is formed in the recess such that the extension electrode has a thickness that does not exceed a depth of the recess, wherein the forming of the extension electrode further comprises:

forming a film of an electroconductive material on a region of the frame body of the quartz crystal resonator or the package member, with the region including the recess, and forming the extension electrode in the recess by polishing the electroconductive material until the frame body of the quartz crystal resonator or the package member is exposed.

18. The method of manufacturing a quartz crystal unit according to claim 17, wherein the second substrate is made of a quartz crystal, and wherein the polishing comprises polishing the junction region of each of the frame body of the quartz crystal resonator and the package member to have a root-mean-square surface roughness (Rms) of less than 1 nm.

19. The method of manufacturing a quartz crystal unit according to claim 14, wherein the joining of the first substrate to the second substrate comprises applying a pressure of 1.7 MPa or more in a heating atmosphere of 400 degrees or more and 550 degrees or less.

20. The method of manufacturing a quartz crystal unit according to claim 19, wherein the joining of the first substrate to the second substrate is performed in an atmosphere having a pressure lower than an atmospheric pressure.

21. The method of manufacturing a quartz crystal unit according to claim 14, further comprising:

forming a plurality of the second substrates;

joining the first substrate to one of the plurality of second substrates such that the package member is joined to an entire periphery of the frame body on one side of the pair of excitation electrodes; and joining the first substrate to another of the plurality of second substrates such that the package member is joined to an entire periphery of the frame body on the other side of the pair of excitation electrodes.

* * * * *